US012796521B2

United States Patent

(12) United States Patent
Theil et al.

(10) Patent No.: US 12,796,521 B2
(45) Date of Patent: Nov. 10, 2026

(54) LOW STRESS DIRECT HYBRID BONDING

(71) Applicant: ADEIA SEMICONDUCTOR BONDING TECHNOLOGIES INC., San Jose, CA (US)

(72) Inventors: Jeremy Alfred Theil, Mountain View, CA (US); Cyprian Emeka Uzoh, San Jose, CA (US); Guilian Gao, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 610 days.

(21) Appl. No.: 18/068,150

(22) Filed: Dec. 19, 2022

(65) Prior Publication Data

US 2023/0197655 A1 Jun. 22, 2023

Related U.S. Application Data

(60) Provisional application No. 63/293,011, filed on Dec. 22, 2021.

(51) Int. Cl.
*H10W 72/90* (2026.01)
*H10W 90/00* (2026.01)

(52) U.S. Cl.
CPC .......... *H10W 72/90* (2026.01); *H10W 72/923* (2026.01); *H10W 72/952* (2026.01); *H10W 72/953* (2026.01); *H10W 90/792* (2026.01)

(58) Field of Classification Search
CPC ........ H01L 24/08; H01L 24/05; H10W 72/90; H10W 72/923; H10W 72/953; H10W 90/792
See application file for complete search history.

(56) References Cited

U.S. PATENT DOCUMENTS 5,753,536 A 5/1998 Sugiyama et al.
5,755,859 A 5/1998 Brusic et al.
(Continued)

FOREIGN PATENT DOCUMENTS

FR 3025051 A1 2/2016
JP 2013-033786 A 2/2013
(Continued)

OTHER PUBLICATIONS

International Search Report and Written Opinion, dated Apr. 27, 2023, for PCT Application No. PCT/US2022/081974, 14 pages.
(Continued)

*Primary Examiner* — Nathan W Ha
(74) *Attorney, Agent, or Firm* — KNOBBE, MARTENS, OLSON & BEAR, LLP

(57) ABSTRACT

Methods for fabrication dielectric layers having conductive contact pads, and directly bonding the dielectric and conductive bonding surfaces of the dielectric layers. In some aspects, the method includes disposing a polish stop layer on dielectric bonding surfaces on top of a dielectric layer. A conductive layer is disposed on top of the polish stop layer and then polished to form conductive contact pads having polished conducting bonding surfaces. During the polishing process, the polish stop layer reduces rounding of dielectric edges and erosion of the dielectric bonding surfaces between closely spaced conductive bonding surfaces. The resulting polished dielectric and conductive bonding surfaces are
(Continued)

directly bonded to dielectric and conductive bonding surfaces of another dielectric layer to form conductive interconnects.

20 Claims, 10 Drawing Sheets

(56) References Cited

U.S. PATENT DOCUMENTS 5,771,555 A 6/1998 Eda et al.
6,080,640 A 6/2000 Gardner et al.
6,423,640 B1 7/2002 Lee et al.
6,465,376 B2 * 10/2002 Uzoh ................ H01L 21/76883 438/626
6,465,892 B1 10/2002 Suga
6,887,769 B2 5/2005 Kellar et al.
6,908,027 B2 6/2005 Tolchinsky et al.
7,045,453 B2 5/2006 Canaperi et al.
7,105,980 B2 9/2006 Abbott et al.
7,193,423 B1 3/2007 Dalton et al.
7,323,736 B2 1/2008 Pradeep et al.
7,750,488 B2 7/2010 Patti et al.
7,803,693 B2 9/2010 Trezza
8,183,127 B2 5/2012 Patti et al.
8,349,635 B1 1/2013 Gan et al.
8,377,798 B2 2/2013 Peng et al.
8,441,131 B2 5/2013 Ryan
8,476,165 B2 7/2013 Trickett et al.
8,482,132 B2 7/2013 Yang et al.
8,487,410 B2 * 7/2013 Yu ....................... H01L 21/3212 257/621
8,501,537 B2 8/2013 Sadaka et al.
8,524,533 B2 9/2013 Tong et al.
8,620,164 B2 12/2013 Heck et al.
8,647,987 B2 2/2014 Yang et al.
8,697,493 B2 4/2014 Sadaka
8,716,105 B2 5/2014 Sadaka et al.
8,802,538 B1 8/2014 Liu
8,809,123 B2 8/2014 Liu et al.
8,828,745 B2 * 9/2014 Tsao .................... H01L 21/3212 438/692
8,841,002 B2 9/2014 Tong
9,087,821 B2 7/2015 Lin
9,093,350 B2 7/2015 Endo et al.
9,142,517 B2 9/2015 Liu et al.
9,159,696 B2 * 10/2015 Daubenspeck ......... H01L 24/03
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,287,197 B2 * 3/2016 Lin ................... H01L 23/53295
9,299,736 B2 3/2016 Chen et al.
9,312,229 B2 4/2016 Chen et al.
9,331,149 B2 5/2016 Tong et al.
9,337,235 B2 5/2016 Chen et al.
9,385,024 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,496,239 B1 11/2016 Edelstein et al.
9,520,361 B2 12/2016 Kang et al.
9,536,848 B2 1/2017 England et al.
9,559,081 B1 1/2017 Lai et al.
9,620,481 B2 4/2017 Edelstein et al.
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,780,035 B1 10/2017 Briggs et al.
9,799,587 B2 10/2017 Fujii et al.
9,852,988 B2 12/2017 Enquist et al.
9,893,004 B2 2/2018 Yazdani
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,707,087 B2 7/2020 Uzoh et al.
10,727,122 B2 7/2020 Backes et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,937,755 B2 3/2021 Shah et al.
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil
11,069,734 B2 7/2021 Katkar
11,088,099 B2 8/2021 Katkar et al.
11,127,738 B2 9/2021 DeLaCruz et al.
11,158,573 B2 10/2021 Uzoh et al.
11,158,606 B2 10/2021 Gao et al.
11,169,326 B2 11/2021 Huang et al.
11,171,117 B2 11/2021 Gao et al.
11,176,450 B2 11/2021 Teig et al.
11,195,748 B2 12/2021 Uzoh et al.
11,205,625 B2 12/2021 DeLaCruz et al.
11,244,920 B2 * 2/2022 Uzoh ...................... H01L 25/50
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,296,053 B2 4/2022 Uzoh et al.
11,329,034 B2 5/2022 Tao et al.
11,348,898 B2 5/2022 DeLaCruz et al.
11,355,404 B2 6/2022 Gao et al.
11,355,443 B2 6/2022 Huang et al.
11,367,652 B2 6/2022 Uzoh et al.
11,373,963 B2 6/2022 DeLaCruz et al.
11,380,597 B2 7/2022 Katkar et al.
11,385,278 B2 7/2022 DeLaCruz et al.
11,387,202 B2 7/2022 Haba et al.
11,387,214 B2 7/2022 Wang et al.
11,393,779 B2 7/2022 Gao et al.
11,462,419 B2 10/2022 Haba
11,476,213 B2 10/2022 Haba et al.
11,515,291 B2 11/2022 DeLaCruz et al.
11,552,041 B2 * 1/2023 Fountain, Jr. ........... H01L 24/83
11,735,523 B2 * 8/2023 Uzoh .................... H01L 23/528 257/773
11,742,314 B2 * 8/2023 Uzoh ...................... H01L 24/08 257/777

(56) References Cited

U.S. PATENT DOCUMENTS 11,756,880 B2 * 9/2023 Uzoh .................... H01L 23/481 257/774
11,764,189 B2 * 9/2023 Gao .................... H01L 23/5386 257/774
11,842,894 B2 * 12/2023 Katkar .................... H01L 24/06
11,908,739 B2 * 2/2024 Uzoh .................. H01L 21/7684
11,911,839 B2 * 2/2024 Shah ....................... H01L 24/80
11,955,445 B2 * 4/2024 Gao ...................... H01L 23/481
12,046,571 B2 * 7/2024 Uzoh ...................... H01L 24/05
2003/0186543 A1 10/2003 Jiang et al.
2004/0017011 A1 * 1/2004 Narita ............... H01L 21/76807 438/643
2004/0084414 A1 5/2004 Sakai et al.
2005/0077595 A1 4/2005 Huang et al.
2006/0057945 A1 3/2006 Hsu et al.
2007/0105366 A1 5/2007 Aubel et al.
2007/0111386 A1 5/2007 Kim et al.
2008/0054444 A1 3/2008 Tuttle
2008/0079112 A1 * 4/2008 Uchiyama .............. H10D 89/10 257/E29.345
2009/0134517 A1 * 5/2009 Usui ................. H01L 21/76843 438/618
2010/0078770 A1 4/2010 Purushothaman et al.
2010/0155951 A1 6/2010 Koike et al.
2011/0084403 A1 4/2011 Yang et al.
2012/0045893 A1 2/2012 Koerner
2012/0094469 A1 4/2012 Landru
2012/0097638 A1 4/2012 Tong et al.
2012/0196442 A1 * 8/2012 Deng .................. H01L 21/3212 438/693
2012/0202348 A1 * 8/2012 Tomiyama ........... H10D 30/792 438/692
2013/0009321 A1 1/2013 Kagawa et al.
2013/0011938 A1 1/2013 Tsao et al.
2013/0014978 A1 1/2013 Uzoh et al.
2013/0122719 A1 5/2013 De Vries
2013/0207271 A1 8/2013 Hagimoto et al.
2013/0320556 A1 12/2013 Liu et al.
2014/0011754 A9 1/2014 Cai et al.
2014/0021614 A1 1/2014 Yu et al.
2014/0117546 A1 5/2014 Liu et al.
2014/0175655 A1 * 6/2014 Chen ....................... H01L 24/11 228/172
2014/0264911 A1 * 9/2014 Lin ....................... H01L 23/535 257/774
2014/0264948 A1 9/2014 Chou et al.
2015/0021771 A1 1/2015 Lin
2015/0021789 A1 1/2015 Lin
2015/0064498 A1 3/2015 Tong
2015/0076688 A1 * 3/2015 Daubenspeck ......... H01L 24/11 257/737
2015/0108644 A1 4/2015 Kuang et al.
2015/0243611 A1 8/2015 Liu et al.
2015/0262976 A1 9/2015 Edelstein et al.
2015/0371953 A1 12/2015 Yu et al.
2016/0013099 A1 * 1/2016 Tanida .................... H01L 25/18 438/107
2016/0013160 A1 1/2016 Chun et al.
2016/0020197 A1 1/2016 Kang et al.
2016/0118335 A1 4/2016 Lee et al.
2016/0141202 A1 5/2016 Xue et al.
2016/0141249 A1 5/2016 Kang et al.
2016/0190066 A1 6/2016 Lin et al.
2016/0197049 A1 7/2016 Chen et al.
2016/0336231 A1 11/2016 Tsai et al.
2016/0343682 A1 11/2016 Kawasaki
2016/0343762 A1 11/2016 Kagawa et al.
2017/0025381 A1 1/2017 Tsai et al.
2018/0138224 A1 5/2018 Haneda
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0204868 A1 7/2018 Kuo et al.
2018/0219038 A1 8/2018 Gambino et al.
2018/0226371 A1 8/2018 Enquist
2018/0323177 A1 11/2018 Yu et al.
2018/0323227 A1 11/2018 Zhang et al.
2018/0331066 A1 11/2018 Uzoh et al.
2018/0350674 A1 * 12/2018 Uzoh ................ H01L 21/76874
2019/0088618 A1 3/2019 Tsumura et al.
2019/0096842 A1 3/2019 Fountain, Jr. et al.
2019/0109042 A1 4/2019 Katkar et al.
2019/0115277 A1 4/2019 Yu et al.
2019/0122931 A1 4/2019 Huang et al.
2019/0131277 A1 5/2019 Yang et al.
2019/0267353 A1 8/2019 Soares et al.
2019/0333550 A1 10/2019 Fisch
2019/0385935 A1 12/2019 Gao et al.
2019/0385963 A1 12/2019 Chen et al.
2020/0013765 A1 1/2020 Fountain, Jr. et al.
2020/0027868 A1 1/2020 Lin
2020/0035641 A1 1/2020 Fountain, Jr. et al.
2020/0194396 A1 * 6/2020 Uzoh ...................... H01L 24/82
2020/0235063 A1 7/2020 Chen et al.
2020/0294908 A1 9/2020 Haba et al.
2020/0294971 A1 9/2020 Tanaka et al.
2020/0328162 A1 10/2020 Haba et al.
2020/0395321 A1 12/2020 Katkar et al.
2021/0082754 A1 * 3/2021 Uzoh .................. H01L 21/3212
2021/0098412 A1 4/2021 Haba et al.
2021/0118864 A1 4/2021 DeLaCruz et al.
2021/0143125 A1 5/2021 DeLaCruz et al.
2021/0159117 A1 5/2021 Wang et al.
2021/0181510 A1 6/2021 Katkar et al.
2021/0193603 A1 6/2021 Katkar et al.
2021/0193624 A1 6/2021 DeLaCruz et al.
2021/0193625 A1 6/2021 DeLaCruz et al.
2021/0242152 A1 8/2021 Fountain, Jr. et al.
2021/0257253 A1 8/2021 Katkar et al.
2021/0265200 A1 8/2021 Kagawa et al.
2021/0287994 A1 9/2021 Hsueh et al.
2021/0296282 A1 9/2021 Gao et al.
2021/0305202 A1 9/2021 Uzoh et al.
2021/0366820 A1 11/2021 Uzoh
2021/0375791 A1 12/2021 Oda et al.
2021/0407941 A1 12/2021 Haba
2022/0077063 A1 3/2022 Haba
2022/0077087 A1 3/2022 Haba
2022/0139867 A1 5/2022 Uzoh
2022/0139869 A1 5/2022 Gao et al.
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0271117 A1 8/2022 Leng
2022/0285303 A1 9/2022 Mirkarimi et al.
2022/0310446 A1 9/2022 Chung et al.
2022/0319901 A1 10/2022 Suwito et al.
2022/0320035 A1 10/2022 Uzoh et al.
2022/0320036 A1 10/2022 Gao et al.
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0132632 A1 5/2023 Katkar et al.
2023/0187317 A1 6/2023 Uzoh
2024/0332227 A1 10/2024 Uzoh et al.
2025/0022752 A1 * 1/2025 Uzoh .................. H01L 21/3212
2025/0273513 A1 8/2025 Katkar et al.

FOREIGN PATENT DOCUMENTS

JP 2017-135247 A 8/2017
JP 2018-160519 10/2018
KR 10-2013-0007972 1/2013
KR 10-2016-0108784 9/2016

(56) References Cited

FOREIGN PATENT DOCUMENTS

| | | | |
|---|---|---|---|
| WO | WO 2005/043584 A2 | 5/2005 |
| WO | WO 2016/152513 A1 | 9/2016 |
| WO | WO 2021/242321 A1 | 12/2021 |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (l), 6 pages.

Plobi, A. et al., "Wafer direct bonding: tailoring adhesion between brittle materials," Materials Science and Engineering Review Journal, 1999, R25, 88 pages.

Yang, Chih-Chao et al., "Co Capping Layers for Cu/Low-k Interconnects," IBM Research, AMC, Albany, NY, Oct. 5-7, 2010, 16 pages.

Bao et al., Mechanistic Study of Plasma Damage of Low k Dielectric Surfaces. J Vac Sci Technol B: Jan. 1, 2008;26(1): 219-226.

Chen et al., Low-Temperature Remote Plasma Enhanced Atomic Layer Deposition of $ZrO_2$/Zircone Nanolaminate Film for Efficient Encapsulation of Flexible Organic Light-Emitting Diodes. Sci Reports. Jan. 6, 2017;7(1): 40061; 9 pages.

Cheng et al., "Plasma Damage on Low-k Dielectric Materials". Vienna, Austria: In Tech Open; Nov. 5, 2018; Chapter 15: 28 pages; http://dx.doi.org/10.5772/intechopen.79494.

Groner et al., "Low-Temperature Al2O3 Atomic Layer Deposition". Chem Materials. Feb. 24, 2004;16(4): 639-645.

OmniVision OV20880 Press Release, "OmniVision Announces New Family of 20-Megapixel PureCel®Plus-S Sensors for High-End Smartphones," www.prnewswire.com/news-releases/omnivision-announces-new-family-of-20-megapixel-purecelplus-s-sensors-for-high-end-smartphones-300358733.html (Nov. 7, 2016), downloaded May 31, 2024; 3 pages.

OmniVision OV20880 Images, cross-section and EDX material analysis of hybrid bonded image sensor product. The part in the images was shipped Sept. 3, 2021. The first image is a cross section showing hybrid bonded parts; the second image is an EDX materials analysis taken through dielectrics on either side of the bond interface; the third image is an EDX materials analysis taken through metal parts on either side of the bond interface. Applicant makes No. representation that the part in the images is identical to the part identified in the separately submitted reference Omnivision OV20880 Press Release (dated Nov. 7, 2016); however, the imaged part and the part shown in Omnivision OV20880 Press Release share the part name "Omnivision OV20880.".

Sony IMX260 images, showing various cross sections and materials analyses for a hybrid bonded back side illuminated CMOS image sensor. The part in the images was shipped in Apr. 2016. Applicant makes No. representation that the part in the images is identical to the part identified in the separately submitted reference MORRISON et al. (Tech Insights article dated Apr. 24, 2016), describing and showing a similar sensor product within the Samsung Galaxy S7; however the imaged part and the part shown in the MORRISON et al. article share the part name "Sony IMX260 image." (8 pages).

Zhu et al., Low-Temperature Plasma-Enhanced Atomic Layer Deposition of SiO2 Using Carbon Dioxide. Nanoscale Research Letters. Dec 2019;14: 1-8.

Extended European Search Report in EP 22912638.8, dated Nov. 14, 2025, in 11 pages.

European Extended Search Report, re EP Application No. 25227107.7, dated May 18, 2026 10 pages.

European Extended Search Report, re EP Application No. 25227115.0, dated May 18, 2026 9 pages.

* cited by examiner

LOW STRESS DIRECT HYBRID BONDING

INCORPORATION BY REFERENCE TO ANY PRIORITY APPLICATIONS

This application claims priority to U.S. Provisional Patent Application No. 63/293,011, entitled "LOW STRESS DIRECT HYBRID BONDING", filed Dec. 22, 2021, the entire contents of which are hereby incorporated by reference in their entirety and for all purposes.

BACKGROUND

Field

The field relates to structures having hybrid bonding surfaces including dielectric and conductive regions and methods for forming the same.

Description of the Related Art

Semiconductor elements, such as integrated device dies or chips, may be mounted or stacked on other elements. For example, a semiconductor element can be stacked on top of another semiconductor element, e.g., a hybrid bonding surface of a first integrated device die can be bonded on to a hybrid bonding surface of a second integrated device die. The bonded elements can electrically communicate with one another through contact pads included in the hybrid bonding surfaces. It can be important to ensure that contact pads on opposing semiconductor elements are aligned, sufficient contact exists between opposing hybrid bonding surfaces and that the electrical connections between contact pads on the two opposing semiconductor elements are reliable. In some cases, a topography of the hybrid bonding surfaces may adversely affect the formation of reliable bonds between dielectric and conductive regions of the integrated device dies.

SUMMARY

Some nonlimiting examples of embodiments discussed herein are provided below.

In a 1st Example, a method comprising:

- providing an opening in a dielectric layer over a substrate of an electronic element;
- forming a polish stop layer on a field area of the dielectric layer and sidewalls of the opening;
- coating a conductive barrier layer over the polish stop layer;
- filling the opening with a conductive material after coating the conductive barrier layer; and
- preparing the electronic element for direct hybrid bonding.

In a 2$^{nd}$ Example The method of Example 1, further comprising polishing the conductive material to remove the conductive material on the conductive barrier layer and above the field area of the dielectric layer to form a conductive contact pad.

In a 3$^{rd}$ Example, the method of Example 2, further comprising removing the conductive barrier layer from over the polish stop layer on the field area prior to preparing the electronic element for direct hybrid bonding.

In a 4$^{th}$ Example, the method of Example 3, wherein removing the conductive barrier layer comprises chemical mechanical polishing with a selective chemistry for stopping on the polish stop layer.

In a 5$^{th}$ Example, the method of Example 3, wherein removing the conductive barrier layer comprises chemical mechanical polishing with end stop detection for stopping on the polish stop layer.

In a 6$^{th}$ Example, the method of Example 3, further comprising removing the polish stop layer from over the field area prior to preparing the electronic element for direct hybrid bonding.

In a 7$^{th}$ Example, the method of Example 6, wherein removing the polish stop layer comprises chemical mechanical polishing with a selective chemistry for stopping on the dielectric layer.

In an 8$^{th}$ Example, the method of Example 6, wherein removing the polish stop layer comprises chemical mechanical polishing with end stop detection for stopping on the dielectric layer.

In a 9$^{th}$ Example, The method of Example 3, wherein preparing the electronic element for direct hybrid bonding comprises activating the polish stop layer for direct hybrid bonding.

In a 10$^{th}$ example, the method of any of the preceding examples, wherein preparing the electronic element for direct hybrid bonding comprises terminating an upper surface of the electronic element with nitrogen species.

In an 11$^{th}$ Example, the method of any of the preceding examples, wherein the polish stop layer is an insulating material.

In a 12$^{th}$ Example, the method of Example 11, wherein the polish stop layer comprises a material selected from the group consisting of diamond-like carbon, aluminum oxide, silicon carbonitride, silicon carbide, silicon nitride and combinations thereof.

In a 13$^{th}$ Example, the method of any of the preceding claims, wherein a top width of the opening is at least 10% larger than a bottom width of the opening.

In a 14$^{th}$ Example, the method of any of the preceding claims, wherein angles between the sidewalls of the opening and a surface of the field area are larger than 100 degrees.

In a 15$^{th}$ Example, the method of any of the preceding examples wherein the conductive barrier layer comprises a metal nitride.

In a 16$^{th}$ Example, the method of any of Examples 1-12, wherein the conductive barrier layer comprises a material selected from the group consisting of titanium (Ti), titanium nitride (TiN), tantalum (Ta), tantalum nitride (TaN), tantalum oxide (tantalum with a small amount of oxygen content, tungsten (W), tungsten nitride (WN), cobalt-phosphorus alloy (CoP), cobalt-tungsten alloy CoW, Cobalt silicate (CoSi,) Nickel-Vanadium (NiV), and combinations thereof.

In a 17$^{th}$ Example, the method of any of the preceding examples, further comprising removing the polish stop layer from a bottom of the opening to reveal a portion of a lower conductive element prior to coating the conductive barrier layer.

In a 18th Example, the method of Example 17, wherein providing the opening comprises exposing the portion of the lower conductive element at the bottom of the opening, and removing the polish stop layer comprises revealing the lower conductive element.

In a 19$^{th}$ Example, the method of Example 17, where providing the opening comprises stopping a via etch in a dielectric material above a metal feature, further comprising removing the dielectric material to reveal the portion of the lower conductive element after removing the polish stop layer from the bottom of the opening.

In a 20th Example, the method of any of Examples 1-8, wherein the polish stop layer comprises a conductive material.

In a 21st Example, the method of Example 20, wherein a bottom of the opening comprises a lower conductive element and at least a portion of the polish stop layer is coated on a top surface of the lower conductive element.

In a 22nd Example, the method of Example 19, wherein removing the dielectric material comprises forming a step-like dielectric layer above the lower conductive element and below a portion of the polish stop layer.

In a 23rd Example, the method of Example 21, wherein preparing the electronic element for direct hybrid bonding comprises activating the field area of the dielectric.

In a 24th Example, the method of any of the preceding examples, wherein coating the polish stop layer comprises a vapor deposition process.

In a 25the Example, the method of any of the preceding examples, wherein the dielectric layer comprises a bonding layer over a redistribution layer, and the electronic component comprises an integrated circuit.

In a 26th Example, the method of any of the preceding examples, further comprising direct hybrid bonding the electronic component to another component without intervening adhesives.

In a 27th Example, the method of any of the preceding examples, wherein the conductive material is copper.

In a 28th Example, an electronic component for bonding to another electronic component, comprising:

- an upper dielectric layer having an opening therein;
- a conductive barrier layer lining at least sidewalls of the opening;
- a polish stop layer underlying the conductive barrier layer at least between the conductive barrier layer and the upper dielectric layer at the sidewalls;
- a conductive filler within the opening over the conductive barrier layer; and
- wherein an upper surface of the electronic component is planarized and treated for direct hybrid bonding.

In a 29th Example, the electronic component of Example 28, wherein the polish stop material comprises a material selected from the group consisting of diamond-like carbon, aluminum oxide, silicon carbonitride, silicon carbide and combinations thereof.

In a 30th Example, The electronic component of Examples 28 or 29, wherein the upper surface comprises the dielectric layer activated and terminated with a species to strengthen direct covalent bonds with the another electronic component.

In a 31st Example, the electronic component of Example 28 or 29, wherein the upper surface comprises an upper portion of the polish stop layer over the dielectric layer, wherein the upper surface is activated and terminated with a species to strengthen direct covalent bonds with the another electronic component.

In a 32nd Example, the electronic component of Examples 30 or 31, wherein the species comprises nitrogen.

In a 33rd Example, The electronic component of any of Examples 28-32, wherein the opening has a corner transitioning between a field region at the upper surface and the sidewalls, wherein the corner defines a radius of curvature of less than 100 times a thickness of the barrier layer.

In a 34th Example, the electronic component of any of Examples 28-33, wherein the upper surface has a roughness of less than 5 Å rms.

In a 35th Example, the electronic component of any of Examples 28-34, wherein the conductive filler comprises copper.

In a 36th Example, the electronic component of any of Examples 28-35, wherein after the upper surface of the electronic component is planarized, an upper surface of the conductive filler is recessed below the upper surface of the electronic component by less than 20 Å.

In a 37th Example, the electronic component of Example 28, wherein the polish stop layer comprises a conductive material.

In a 38th Example, the electronic component of Example 37, wherein a bottom of the opening comprises a lower conductive element and the polish stop layer is coated on a top surface of the lower conductive element.

In a 39th Example, the electronic component of Example 28, wherein the electronic component is bonded to a second electronic component.

In a 40th The electronic component of any of the preceding Examples, wherein angles between the sidewalls of the opening and a surface of the field area are larger than 100 degrees.

In a 41st Example, a bonded structure comprising:

- a first element comprising a first nonconductive field region, the first nonconductive field region comprising:
- a first opening;
- a first conductive contact pad disposed in the first opening;
- a first polish stop layer lining at least sidewalls of the first opening; and
- a first conductive barrier layer disposed at least between the conductive contact pad and a portion of the first polish layer coated on the sidewalls of the first opening; and
- a second element directly bonded to the first element without an adhesive by way of a hybrid bond.

In a 42nd Example, the bonded structure of Example 41, wherein the second element comprises a second nonconductive field region, the second nonconductive field region comprising:

- a second opening,
- a second conductive contact pad disposed in the second opening,
- a second polish stop layer lining at least sidewalls of the second opening, and
- a second conductive barrier layer disposed at least between the conductive contact pad and a portion of the second polish layer coated on the sidewalls of the second opening.

In a 43rd Example, the bonded structure of any of Examples 41 and 42, wherein the hybrid bond comprises a bond formed between a bonding surface of the first nonconductive field region and a bonding surface of the second nonconductive field region.

In a 44th Example, the bonded structure of any of Examples 41 and 42, wherein:

- the first polish stop layer further covers a bonding surface of the first nonconductive field region and the sidewalls of the first opening, and
- the second polish stop layer further covers a bonding surface of the second nonconductive field region and the sidewalls of the second opening, In a 45th Example, the bonded structure of Example 44, wherein the hybrid bond comprises a bond formed between a portion of the first polish stop layer coated on the bonding surface of the first nonconductive field region and a portion of the second polish stop layer coated on the bonding surface of the second nonconductive field region.

In a 46th Example, the bonded structure of Example 41, wherein the first polish stop layer has a thickness along a direction perpendicular to the sidewalls of the first opening, wherein the thickness is less than 1000 nm.

In a 47th Example, the bonded structure of Example 41, wherein angles between the sidewalls of the first opening and a surface of the field area are larger than 100 degrees.

In a 48th Example, the bonded structure of any of the Example 42-46, wherein the hybrid bond further comprises a first bond formed between the first conductive contact pad and the second conductive contact pad.

In a 49th Example, the bonded structure of any of Examples 42-48, wherein the first and the second conductive contact pads comprise copper.

In a 50th Example, the bonded structure of any of Examples 42-49, wherein the first and the second polish stop layers are insulating materials.

In a 51st Example, the bonded structure of any of Examples 42-50, wherein the first and the second polish stop layers comprise a material selected from the group consisting of diamond-like carbon, aluminum oxide, silicon carbonitride, silicon carbide and combinations thereof.

In a 52nd Example, the bonded structure of any of Examples 42-51, wherein the first and the second conductive barrier layers comprise a metal nitride.

In a 53rd Example, the bonded structure of Example 52, wherein the first and the second conductive barrier layers comprise a material selected from the group consisting of titanium (Ti), titanium nitride (TiN), tantalum (Ta), tantalum nitride (TaN), tantalum oxide (tantalum with a small amount of oxygen content, tungsten (W), tungsten nitride (WN), cobalt-phosphorus alloy (CoP), cobalt-tungsten alloy CoW, Cobalt silicate (CoSi,) Nickel-Vanadium (NiV), and combinations thereof.

In a 54th Example, the bonded structure of any of Examples 42-53, further comprising a first redistribution layer below the first conductive contact pad and a second redistribution layer below the second conductive contact pad.

In a 55th Example, the bonded structure of Example 54, wherein a portion of the first barrier layer is in electrical contact with the first redistribution layer and a portion of the second barrier layer is in electrical contact with the second redistribution layer.

In a 56th Example, the bonded structure of Example 54, wherein a portion of the first polish stop layer is in contact with the first redistribution layer and a portion of the second polish stop layer is in contact with the second redistribution layer.

In a 57th Example, the bonded structure of any of Examples 42-43, wherein the polish stop layer is a conductive material.

In a 58th Example, the bonded structure of Example 57, further comprising a first redistribution layer below the first conductive contact pad and a second redistribution layer below the second conductive contact pad, wherein a portion of the first polish stop layer is in electric contact with the first redistribution layer and a portion of the second polish stop layer is in electric contact with the second redistribution layer.

In a 59th Example, the bonded structure of any of Examples 41 and 42, wherein:

the first opening has a corner transitioning between a bonding surface of the first nonconductive field region and the sidewalls of the first opening, the second opening has a corner transitioning between a bonding surface of the second nonconductive field region and the sidewalls of the second opening, wherein each corner defines a radius of curvature of less than 10% of a width of the first and the second conductive contact pads.

In a 60th Example, the bonded structure of any of Examples 41-59, wherein the first element comprises a first dielectric layer of a first integrated circuit, and the second element comprises a second dielectric layer of a second integrated circuit.

In 61st Example, the method comprising:

providing an opening in a dielectric layer over a substrate of an electronic element;

forming a polish stop layer on a field area of the dielectric layer and sidewalls of the opening, filling the opening with a conductive material after forming the polish stop layer;

forming a planar bonding surface on the polish stop layer and the conductive material; and preparing the electronic element for direct hybrid bonding.

In a 62nd Example, the method of Example 61, further comprising polishing the conductive material to remove the conductive material on the formed polish layer to form a conductive contact pad, wherein a top surface of the conductive contact pad is recessed with respect to the planar bonding surface.

In a 63rd Example, the method of Example 61, wherein the hardness of the formed stop polish layer is higher than the hardness of the dielectric layer beneath.

In a 64th Example, a directly bonded element comprising:

an opening in a dielectric layer over a substrate of the element;

a polish stop layer on a field area of the dielectric layer and sidewalls of the opening;

a planar conductive material disposed over the polished stop layer in the opening in the dielectric layer; and wherein the hardness of the stop polish layer is higher than the hardness of the dielectric layer beneath.

In a 65th Example, the directly bonded element of Example 64, further comprising a barrier layer disposed between the polish stop layer and the planar conductive material.

In a 66th Example, an element comprising:

an opening in a dielectric layer over a substrate of the element;

a polish stop layer on a field area of the dielectric layer and sidewalls of the opening;

a conductive material disposed over the polished stop layer in the opening in the dielectric layer; and wherein the hardness of the polish stop layer is higher than the hardness of the dielectric layer beneath.

DETAILED DESCRIPTION

Figure 1A:
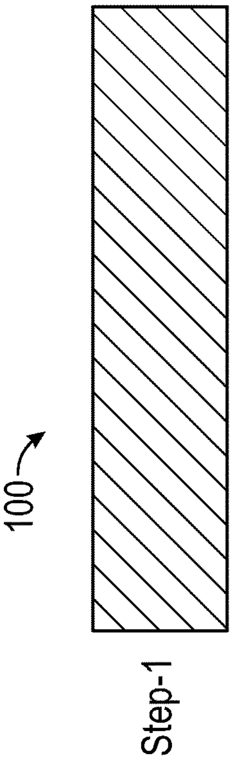
FIGS. 1A-1E illustrate an example process for fabricating a dielectric layer having a hybrid bonding surface with a conductive contact pad, and a directly bonded structure formed by bonding the hybrid bonding surfaces of two dielectric layers each having at least one conductive contact pad.

There is a growing demand for directly bonding semiconductor elements having contact pads arranged at a fine pitch, so as to increase interconnect density and provide improved electrical capabilities. Direct hybrid bonds may be formed by fabricating semiconductor elements (e.g., wafers or dies) having polished bonding surfaces including a non-conductive field region and a plurality of conductive features (e.g., conductive contact pads) at least partially embedded in the nonconductive field region. The nonconductive field regions of two semiconductor elements can be directly bonded at low temperature without using an adhesive to form a bonded structure. The bonded structure can be heated to cause expansion of the conductive contact pads so as to form a bond between opposing surfaces of the conductive contact pads. Accordingly, a hybrid bonding surface comprises nonconductive (e.g., dielectric) and conductive regions formed on the nonconductive layer. Upon polishing, various parameters may affect the topography of resulting polished hybrid bonding surface. For example, the presence of stress variation over the hybrid bonding surface, may result in formation of stress induced topography in hybrid bonding surface. Stress induced topography can degrade the quality of the hybrid bond between a dielectric layer or a nonconductive field region of an element and a dielectric layer or a nonconductive field region of another element. For example, the rounding of dielectric edges in the vicinity of the interface between field dielectric and a conductive pad and erosion of dielectric bonding regions, may adversely affect the bonding between the conducting pads of hybrid bonding surfaces. Various methods and structures disclosed herein may be used to mitigate stress induced topography and improve the yield and quality of the resulting interconnects. For example, some of the disclosed techniques may reduce erosion of dielectric bonding regions between closely spaced contact pads and rounding of dielectric edges, over a hybrid bonding surface.

Examples of Direct Bonding Methods and Directly Bonded Structures

Various embodiments disclosed herein relate to directly bonded structures in which two elements (e.g., two semiconducting elements) can be directly bonded to one another without an intervening adhesive. In some cases, an element may be an electronic element comprising a substrate and electronic components, conductive contact pads and conductive lines disposed on or above the substrate. In particular, directly bonded structures having one or more conductive interconnects (or vias) formed by direct bonding of conductive contact pads are described. Such directly bonded structures, which can comprise direct hybrid bonds, may be referred to as Direct Bond Interconnects (DBI®).

Two or more semiconductor elements (such as integrated device dies, wafers, etc.) may be stacked on or bonded to one another to form a bonded structure and allow electric contact between one or more conductive lines in a first element and one or more conductive lines in a second element. Conductive contact pads of the first element may be electrically connected to corresponding conductive contact pads of the second element. Any suitable number of elements can be stacked in the bonded structure.

In some embodiments, the elements are directly bonded to one another without an adhesive. In various embodiments, each element may include a non-conductive field region comprising at least one non-conductive material (dielectric material). In some examples, a non-conductive field region of an element is a dielectric layer. A dielectric layer of the first element can be directly bonded to a corresponding dielectric layer of the second element without an adhesive. A region of a dielectric layer that is bonded to the corresponding region of another dielectric layer can be referred to as nonconductive bonding region, dielectric bonding region, or bonding region. In some cases, the bonding region of the dielectric layer may have a dielectric bonding surface or bonding surface. The bonding surface of a dielectric layer may be also referred to as a field area or a field region of the dielectric layer. In some embodiments, the nonconductive material of the first element can be directly bonded to the corresponding nonconductive material of the second element using dielectric-to-dielectric bonding techniques. In some cases, a first bonding region may have a first bonding surface and a second bonding region may have a second bonding surface. For example, dielectric-to-dielectric bonds may be formed between the first bonding surface of the first element and the second bonding surface of the second element without an adhesive using the direct bonding techniques disclosed at least in U.S. Pat. Nos. 9,564,414; 9,391,143; and 10,434,749, the entire contents of each of which are incorporated by reference herein in their entirety and for all purposes.

In some examples, the bonding surface of the dielectric bonding regions can be polished to a high degree of smoothness (e.g., to improve a dielectric-to-dielectric bond). The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes. In various embodiments, the bonding surface prepared by the procedure described above may enable forming a bond between the first and the second element without an intervening adhesive.

In some embodiments, a dielectric layer may include one or more conductive contact pads. A conductive contact pad (also referred to as "contact pad") comprises a conductive material (e.g., copper, nickel, gold, or a metal alloy) and may be embedded in the dielectric layer. In some examples, a conductive contact pad may comprise a conductive bonding surface (e.g., a polished conductive surface) that can form a bond with the conductive bonding surface of another conductive contact pad without an adhesive. The bond formed between two contact pads (e.g., via their conductive bonding surfaces), can be an electrically conductive bond.

In some embodiments, a surface of the dielectric layer that includes a contact pad may comprise a hybrid bonding surface comprising the bonding surface (dielectric bonding surface) of the dielectric layer and the conductive bonding surface of the conductive contact pad.

In various embodiments, the hybrid bonding surfaces described above may form hybrid direct bonds between the first and the second element without an intervening adhesive. A hybrid direct bond may comprise at least one conductive region or contact pad in addition to the dielectric bonding region. In some embodiments, each element may include one or more conductive contact pads. In these embodiments, the conductive contact pads of the first element can be directly bonded to corresponding conductive contact pads of the second element.

For example, a hybrid bonding technique can be used to provide conductor-to-conductor direct bonds along a bond interface formed between two conductive bonding surfaces and between covalently direct bonded dielectric-to-dielectric surfaces, prepared as described above. In various embodiments, the conductor-to-conductor (e.g., contact pad to contact pad) direct bonds and the dielectric-to-dielectric direct bonds can be formed using the direct bonding techniques disclosed at least in U.S. Pat. Nos. 9,716,033 and 9,852,988, the entire contents of each of which are incorporated by reference herein in their entirety and for all purposes. Conductive contact pads (which may be surrounded by nonconductive dielectric field regions) may also directly bond to one another without an intervening adhesive.

In some embodiments, the respective contact pads can be recessed below bonding surfaces of the dielectric layer. In some examples, the conductive bonding surface of the contact pads of a dielectric layer can be recessed by less than 30 nm, less than 20 nm, less than 15 nm, or less than 10 nm, for example, or recessed in a range of 2 nm to 20 nm, or in a range of 4 nm to 10 nm, with respect to a bonding surface of the dielectric layer. In some examples, the conductive bonding surface of a contact pad can be recessed below the bonding surface by less than 5 Å, 10 Å, 20 Å, or 100 Å. In some cases, a dielectric edge may be formed in the vicinity of an interface between the recessed contact pad and the dielectric bonding region. For example, a dielectric edge may be formed between a bonding surface of a dielectric layer and an internal surface of an opening in the dielectric layer where the contact pad is disposed (e.g., by filling the opening with a conductive filler material). The dielectric bonding regions can be directly bonded to one another without an adhesive at room temperature in some embodiments and, subsequently, the bonded structure can be annealed at an elevated temperature (e.g., above room temperature). Upon annealing, the contact pads can expand and contact one another to form a metal-to-metal direct bond. In some examples, when the two contact pads expand, a metal-to-metal direct bond is formed between their conductive bonding surfaces.

Beneficially, the use of hybrid bonding techniques, such as Direct Bond Interconnect, or DBI®, available commercially from Adeia of San Jose, CA, can enable a high density of pads connected across the direct bond interface (e.g., small or fine pitches for regular arrays). In some embodiments, the pitch of the contact pads, or conductive traces embedded in the bonding surface of one of the bonded elements, may be less than 40 microns, or less than 10 microns or even less than 1 microns. For some applications, the ratio of the pitch of the contact pads to one of the dimensions of the contact pad (e.g., the width or the length of the contact pad) can be less than 5, or less than 3 and sometimes desirably less than 2. In other applications, the width of a contact pad (e.g., a longitudinal distance between two ends for the contact pad) embedded in the bonding surface of one of the bonded elements may range between 0.3 to 3 microns. In various embodiments, the contact pads and/or traces can comprise copper, although other metals may be suitable.

Thus, in direct hybrid bonding processes, the dielectric bonding regions and the contact pads of a first element can be directly bonded to those of a second element without an intervening adhesive, and form a bonded structure. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

In one application, a shape and/or a size of the first element can be substantially similar to that of the second element. For example, when both elements are rectangular (such as in the case of a singulated die) or circular (e.g., a wafer), a width of the first element in the bonded structure can be similar to a width of the second element. In some other embodiments, a shape and/or a size of the first element in the bonded structure can be different from a shape and/or a size of the second element, for example in die to wafer or die to larger substrate bonding applications. The width or area of the larger element in the bonded structure may be at least 10% larger than the width or area of the smaller element. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes. In various embodiments, the barrier layer can be a conductive barrier layer or a nonconductive layer. A conductive barrier layer may comprise titanium nitride, tantalum nitride, tungsten, tungsten nitride, and combinations thereof.

Figure 1B:
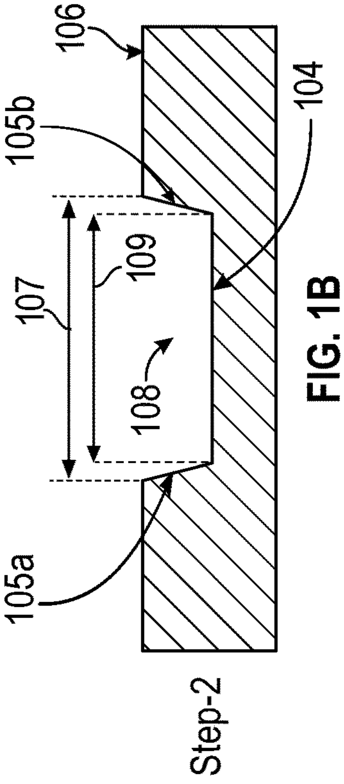
Figure 1C:
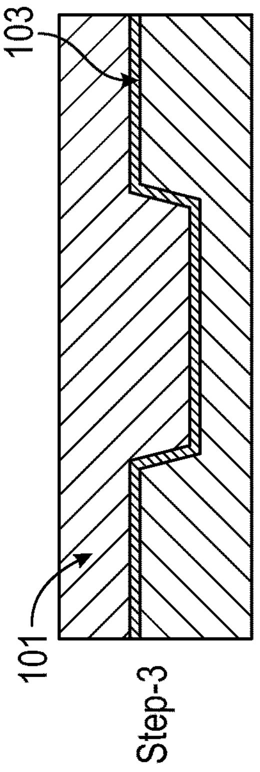
Figure 1D:
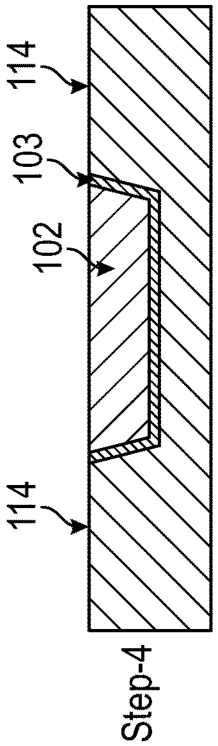

FIGS. 1A-1B illustrate an example process for fabricating a hybrid bonding surface including a nonconductive (e.g., dielectric) layer and a contact pad at least partially embedded in the dielectric layer. At step-1 a first dielectric layer 100 is provided (FIG. 1A) on an element (e.g., a semiconductor element such as a die or wafer). The first dielectric layer 100 may comprise a dielectric layer of a first element. In the disclosed embodiments, the bonding surface (top surface) of the first dielectric layer 100 may comprise a region of the bonding surface of the first element. In some cases, the first element may comprise many (e.g., hundreds or thousands) of such regions on its bonding surface. In some such cases, the first element can comprise a semiconductor device region having electronic circuitry in electrical communication with a plurality of contact pads fabricated on these regions. The portion of the bonding layer (dielectric layer 100) shown in the figures may be disposed on the semiconductor device region of the element. For example, the dielectric layer 100 may be disposed on a substrate of the first element (e.g., a semiconductor device region or layer, such as a silicon device region) using sputtering or a vapor deposition process (e.g., PVD, PECVD, MOCVD, and the like). In various implementations, the dielectric layer 100 may comprise silicon oxide, silicon nitride, silicon oxynitride, silicon oxynitrocarbide, or any other suitable nonconductive layer. At step-2, an opening 108 is provided in the first dielectric layer 100 (FIG. 1B). In some cases, the opening 108 is a contact pad opening where a conductive contact pad is formed. The opening 108 may be provided, for example, by fabricating a patterned mask (e.g., a patterned photoresist layer formed using photolithography, e-beam lithography and other lithographic techniques) on the dielectric layer 100. The patterned mask may cover a portion of the top surface of the dielectric layer 100 leaving one or more other portions exposed. In some cases, the portion of the dielectric layer 100 covered by the patterned mask may comprise a bonding surface or bonding region of the dielectric layer 100. In some cases, the exposed regions of the dielectric layer 100 may be regions where contact pads should be located. A dry or wet etching process may be used to form the opening 108 within the dielectric layer 100 in an exposed region of the dielectric layer 100. In some cases, the bottom surface 104 of the opening 108 can be substantially parallel to the top surface 106 of the dielectric layer 100. In some other cases, the bottom surface 104 of the opening 108 can be slightly sloped with respect to the top surface 106 of the dielectric layer 100 (e.g., with angle less than 5 degrees, or from 5 to 10 degrees). In various implementations, a slope between the top surface 106 of the dielectric layer 100 and bottom surface 104 of the opening 108 may be determined by an etching process used to form the opening 108. The opening 108 has a bottom width 109 and a top width 107. The bottom width 109 can be a width of the bottom 104 surface of the opening 108, e.g., along a direction parallel to the top surface 106 of the dielectric layer 100. The top width 107 can be a width of the opening at top surface 106 of the dielectric layer 100 in a direction parallel to top surface 106. In some embodiments, the top width 107 may be more than 20%, or 30% or 50% wider than the bottom width 109. In some cases, a sidewall 105*a* and/or 105*b* of the opening 108 can make a slope larger than 90 degrees with respect to the top surface 106 of the dielectric layer 100 (or the bottom surface 104). In some examples, the slope of the sidewall 105*a* or the sidewall 105*b* of the opening 108, e.g., with respect to the top surface 106, can be from 95 to 110, from 110 to 120 degrees, from 120 to 130 degrees, from the 130 to 150 degrees, or any ranges formed by these values, or larger or smaller values. At step-3, a barrier layer 103 may be disposed or coated on the dielectric layer 100 followed by deposition of a conductive layer 101 (FIG. 1C). In some cases, e.g., when the conductive layer 101 is disposed using electroplating, a seed layer may be disposed on the barrier layer 103 (e.g., using sputtering, PECVD, PVD and other physical or chemical deposition methods), before the deposition of a conductive layer 101. In various embodiments, the conductive layer 101 may be disposed using thermal evaporation, e-beam evaporation, metal plating and the like. The barrier layer 103 may comprise any suitable type of conductive barrier, such as titanium nitride, tantalum, tantalum nitride, etc. The conductive layer 101 (also referred to as conductive filler) may comprise a conductive material such as copper, nickel, or a conductive alloy. The barrier layer 103 may have a thickness less than 400 nm, less than 100 nm, less than 10 nm, or less than 2 nm. At step-4, the conductive layer 101 is polished to form a polished hybrid bonding surface by removing a portion of the conductive layer 101 and the underlying barrier layer 103 disposed on the bonding surfaces (field area) of the dielectric layer 100 (FIG. 1D). In some examples, the conductive layer 101 may be polished using a chemical mechanical polishing (CMP) process. In some such cases, the CMP process may be a selective CMP process for stopping on the barrier layer 103 or on the dielectric bonding surface. For example, the copper overburden disposed over the field area of the dielectric layer 100 may be removed by a selective CMP process for stopping on the barrier layer 103. In some cases, where the CMP process stops at the barrier layer, a second polishing process may be used to remove the barrier layer. In some cases, at step-4 a bonding surface 114 of the dielectric layer 100 may be polished along with the conductive layer. In various implementations, step-4 may include two or more polishing steps. In some cases, both polishing steps may comprise a physical polishing process followed by a CMP process, but different slurries, pads and process parameters may be used at each step. The processed dielectric layer at the end of step-4 comprises a contact pad 102 and a smooth hybrid bonding surface comprising the conductive bonding surface of the contact pad 102 and the bonding surface (dielectric bonding surface) 114 of the dielectric bonding region. Additionally, at the end of step-4 at least a portion of the sidewall (e.g., the sloped sidewall) of the opening 108 can be covered with the barrier layer 103. In some cases, after polishing, the polished conductive bonding surface of the contact pad 102 may be recessed with respect to the bonding surface of the dielectric layer 100. For example a vertical distance between the polished conductive surface of the contact pad 102 can be from 1 nm to 50 nm. As explained herein, in various embodiments, during the polishing process (step-4), the dielectric edges between the dielectric bonding surface 114 and the contact pad 102 may become rounded, e.g., because of a change of dielectric stress level at and/or near the portion of the dielectric layer 100 that is in contact with the contact pad 102 or the barrier layer 103.

In some embodiments, after step-4 the polished hybrid surface may be further prepared for a direct hybrid bonding process. In some cases, the dielectric bonding surface 114 or the field area of the hybrid bonding surface may be activated to facilitate direct dielectric-to-dielectric bonding process. For example, the dielectric bonding surface 114 may be terminated with a suitable species, such as a nitrogen species. A similar process may be used to fabricate a second dielectric layer 110 having a second contact pad 112, and to prepare its hybrid bonding surface.

Figure 1E:
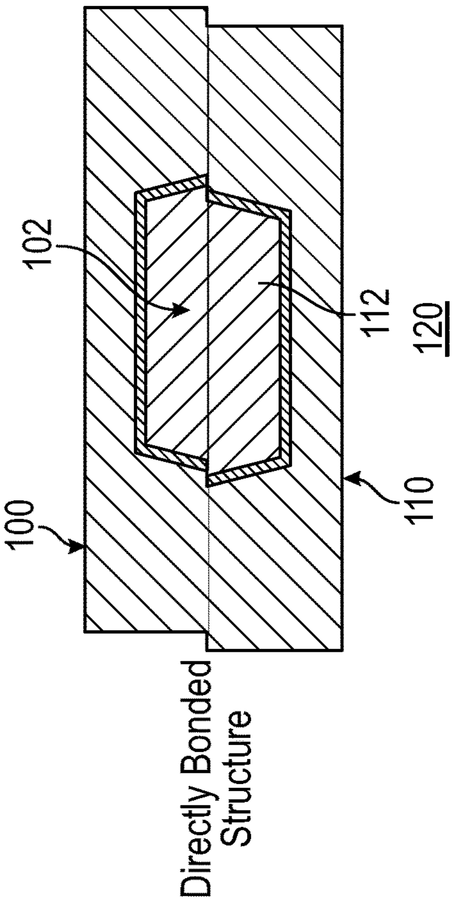

FIG. 1E illustrates a directly bonded structure 120 formed by bonding the hybrid bonding surfaces of the first dielectric layer 100 and the second dielectric layer 110. In some implementations, the nonconductive regions of the hybrid bonding surfaces of the first 100 and the second 110 dielectric layers may be directly bonded and the respective conductive regions may be electrically connected.

Bonding between the first 102 and second 112 contact pads may be affected by a shape of the dielectric edge formed near the interface between the dielectric layers and the contact pads, after the polishing process. The shape of the dielectric edge may be controlled by, for example, a pressure applied during polishing process and stress distribution across the corresponding hybrid bonding surface. For example, a stress variation near the dielectric edge may result in formation of a rounded dielectric edge during the polishing process. In some examples, rounded dielectric edges in the hybrid bonding surface of the first and/or the second dielectric layer 100/110 may prevent intimate contact between the opposing hybrid bonding surfaces and result in formation of a weak bonds between them and between the first and the second contact pads 102/112.

Figure 2A:
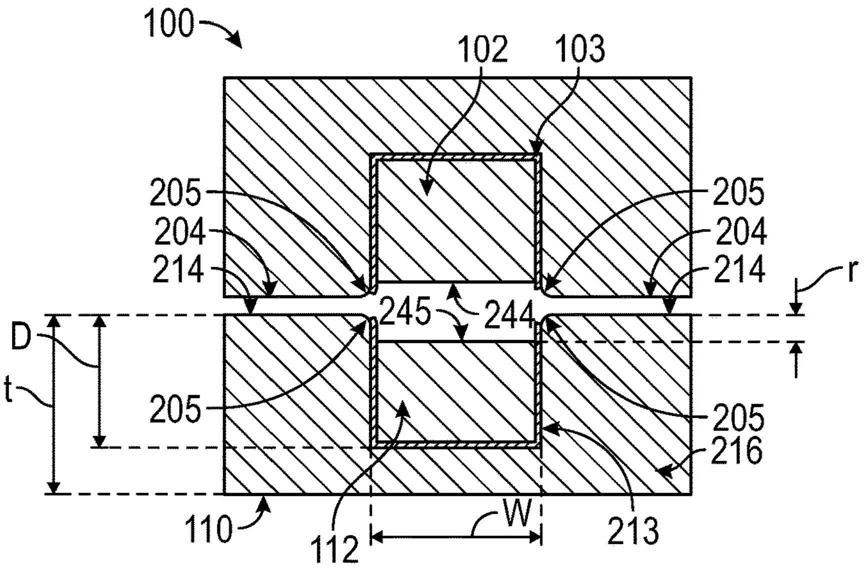
FIGS. 2A-2C illustrate an example of direct hybrid bonding process in which two dielectric layers having conductive contact pads are directly bonded to one another.
Figure 2B:
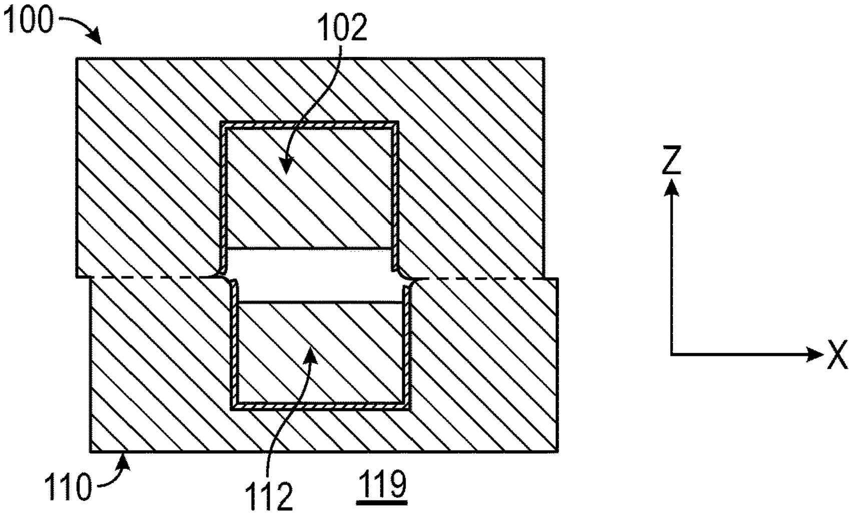
Figure 2C:
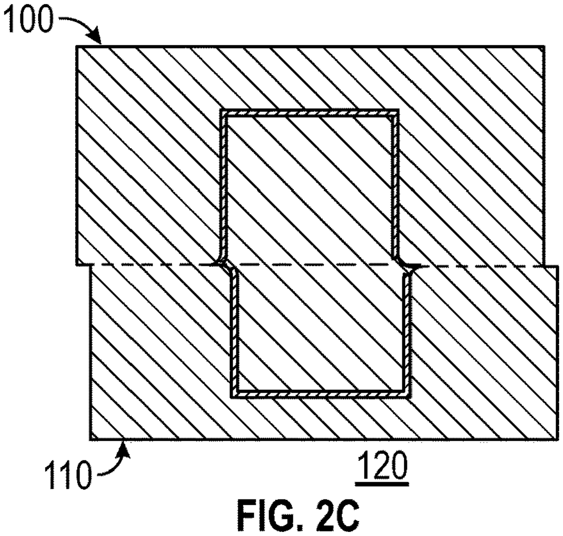

FIGS. 2A-2C illustrate an example of direct hybrid bonding process in which a first element 100 (e.g., a first semiconductor element including a first dielectric layer) having a first contact pad 102 is directly bonded to a second element 110 (e.g., a second semiconductor element including a second dielectric layer) having a second contact pad 112. FIG. 2A illustrates the first element 100 and the second element 110 before bonding. In some cases, a contact pad may comprise a conductive material (e.g., copper) disposed in an opening in the corresponding dielectric layer. In the example shown, a barrier layer 103 (or 213) is disposed between the contact pad 102 (or 112) and the surfaces of the corresponding opening in the dielectric layer. In some embodiments, the barrier layer 103/213 may not exist and the contact pad may be directly in contact with the dielectric layer. In other embodiments, a seed layer may be disposed between the barrier layer and the contact pad. As mentioned above, the barrier layers 103/213 can comprise a conductive layer that prevents migration of the conductive material (e.g., copper) from the contact pads 102/112 to the corresponding dielectric layer. In some, cases a depth of the opening in the dielectric layer measured from a bonding surface 214 (or 204), D, can be less than 10 microns, 5 microns, or 2, 1, 0.5 microns. In some cases, the conductive bonding surface 244 (or 245) of the contact pad 102 (or 112) may be recessed with respect to the bonding surface 214 (or 204) of the dielectric layer 100 (or 110). In some such cases, a vertical distance (along z-axis) between the conductive bonding surface 244 (or 245) of the contact pad 102 (or 112) and the corresponding bonding surface 204 (or 214) may be selected to allow hybrid bonding (bonding between the dielectric bonding surfaces and formation of a conductive bond between the contact pad 102 and 112).

A first dielectric bonding region of the first element and a second dielectric bonding region of the second element are polished to generate the first bonding surface 204 on the first element 100 and the second bonding surface 214 on the second element 110. In cases, dielectric edges 205 may be formed between the bonding surfaces 214 or 204, and an inner surface of the opening in which the contact pad 102 or 112 are disposed. In some such cases, dielectric edges 205 may be rounded dielectric edges having a radius of curvature. In some cases, the radius of curvature can be large enough to reduce the strength of the hybrid bond formed between the corresponding hybrid bonding surfaces. As such, in various implementations, reducing the radius of curvatures of the dielectric edges formed on hybrid bonding surfaces of the first 100 and second 110 dielectric layers, may improve the strength of the hybrid bond formed between the hybrid bonding surfaces by increasing the bonding area.

Each contact pad may have a width W along a direction parallel to the corresponding bonding surface. In some cases, a width of the first contact pad 102 and a width of the second contact pad 112 may be substantially equal, or may differ. Once the polished bonding surfaces have been generated on both elements 100/110, they may be aligned such that the bonding surfaces 204 of the first element 100 are substantially parallel with the bonding surfaces 214 of the second element 110, and at least a region of the conductive surface 244 of the contact pad 102 is aligned with a region of the conductive surface 245 of the contact pad 112 in a plane parallel to the bonding surfaces.

FIG. 2B illustrates the first element 100 and the second element 110 after the first and the second contact pads 102/112 are aligned, the corresponding bonding surfaces 214/204 of the first and the second elements 100/110 are brought into contact, and are bonded together (e.g., using the process and mechanisms described above). The bonded structure may be heated at relatively low temperature (e.g., less than 400 degrees) to cause the metallic contacts 102/112 expand and form a direct metal-to-metal (e.g., copper-to-copper) bonds. The metal-to-metal bond can be an electrically conductive junction. The formation of the Cu—Cu bond may be affected by several parameters and factors, including but not limited to, design of the contact pad 102 (e.g., a cross-sectional shape, cross-sectional area and depth of the opening in which the contact pad is formed), recess depth of the metal surface from the dielectric bonding surface, properties of the conductive bonding surface of the contact pad 102 (e.g., grain size and arrangement of grain boundaries), and the like. FIG. 2C, illustrates the resulting bonded structure after the two contact pads 102/112 are joined and are electrically in contact.

Figure 3:
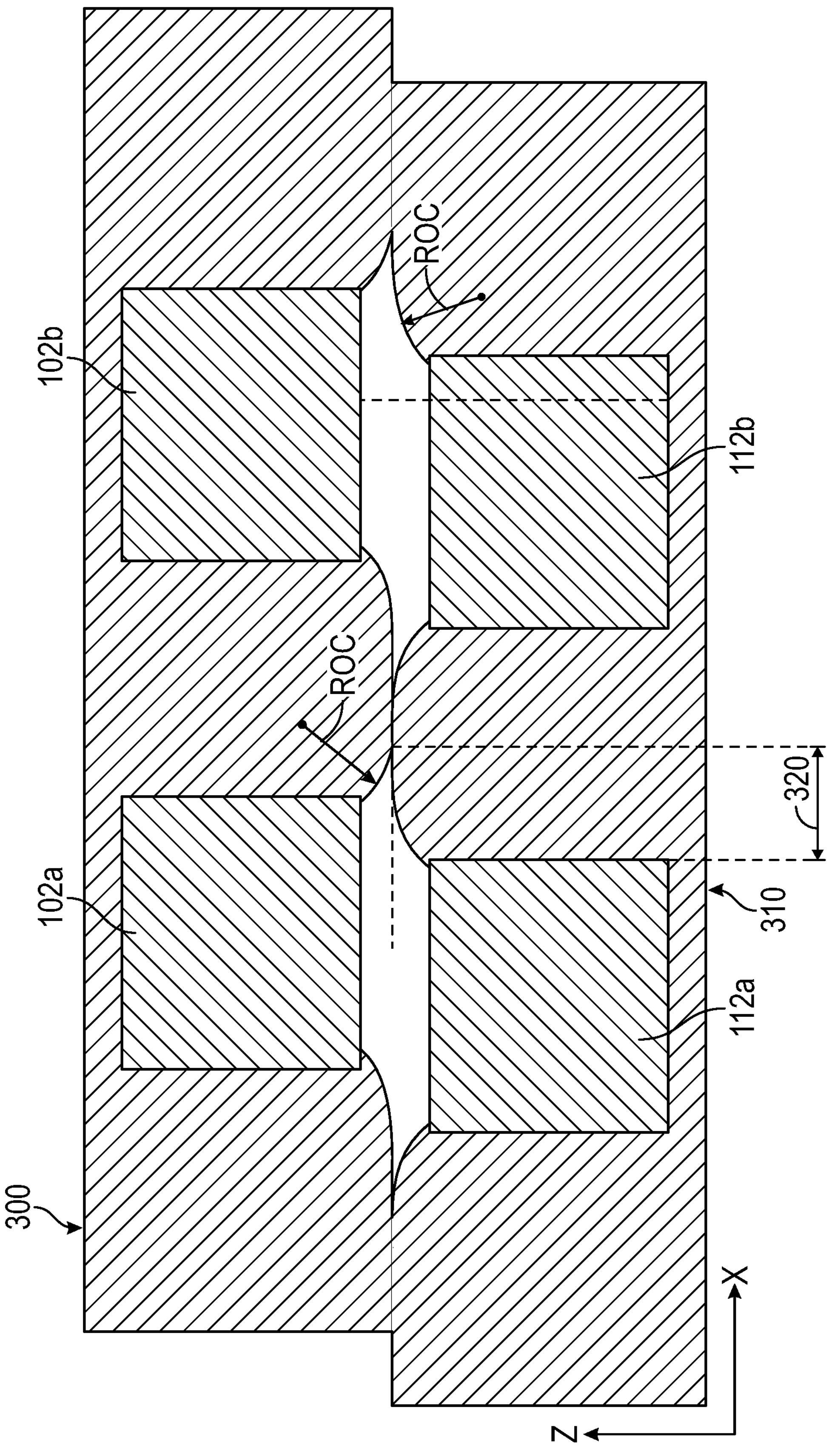
FIG. 3 illustrates two dielectric layers each having two conductive contact pads and a hybrid bonding surface with rounded dielectric edges, brought into contact for hybrid bonding.

FIG. 3 illustrates an example where the dielectric edges of a first 300 and a second element 310 (or first and second dielectric layers of the first and the second elements), are rounded having large radius of curvature (ROC). In some cases, the radius of curvature (ROC) can be the radius of curvature of an eroded dielectric region or surface adjacent to a barrier layer, a contact pad, or a conductive layer. In the example shown, the first element 300 and the second element 310 each have two contact pads 102*a*/102*b* and 112*a*/112*b*, but the element can have many more pads, e.g., hundreds or thousands of pads. In some cases, having rounded dielectric edges with large radius of curvature may reduce a contact area between the opposing dielectric bonding surfaces and result in weak bonding between the first and second elements in the vicinity of the rounded dielectric edges. Dielectric rounding may also increase the thermal budget of the direct bonding process by causing the anneal temperature for forming the metallic bonds to increase. As such, it is desirable to reduce the radius of curvature (ROC) of rounded dielectric edges formed on a dielectric layer adjacent to the barrier layer or conductive layer. In some implementation, the fabrication process shown in FIG. 1 may be modified to reduce the ROCs of such rounded dielectric edges to less than 200 times the thickness of the barrier layer 103 (or 213), less than 100 times the thickness of the barrier layer, or less than 50 times the thickness of the barrier layer. In some embodiment, the ROC of the dielectric region adjacent to the barrier or conductive layer can be less than 25% of the width of the conductive layer, less than 10% of the width of the conductive layer, less than 5% of the width of the conductive layer, less than 2% of the width of the conductive layer.

In some cases, rounded dielectric edges having large radius of curvature may limit the minimum lateral spacing between the contact pads in a direction parallel to the bonding surface (e.g., in the x or y direction). As shown in FIG. 3, the round dielectric edges near the contact pads 120*a*/102*b* of the first element 300, and the contact pads 112*a*/112*b* of the second element 310 may reduce the contact area between the dielectric bonding surfaces of the top first 300 and second 310 elements. When the first 300 and the second 310 elements are brought into contact for bonding, the dielectric surface between contact pads 102*a* and 102*b*, and the dielectric surface between contact pads 112*a* and 112*b*, may be separated with tapered gaps and have a small contact area. As such, to increase the dielectric bonding surface between laterally separated adjacent pads, a lateral distance between the two adjacent pads may need to be larger than a lateral extension 320 of the rounded edge at least by a factor of two. A lateral extension of a rounded edge may be a distance between the side wall of an opening and a flat region of the corresponding bonding surface along a lateral direction (along x-axis) perpendicular to the corresponding bonding surface.

As described above, if rounded dielectric edges form during the polishing process, the curvature of the dielectric edge can adversely affect the hybrid bonding process (e.g., by reducing the bonding area). In some cases, formation of rounded dielectric edges, may be affected and controlled by several factors including but not limited to stress state and values stress near the dielectric edge and across the dielectric field, the properties of the dielectric material, pressure distribution across the bonding surface during the polishing process, polishing speed and duration of the polishing process and other factors. These factors can affect a shape and/or the radius of curvature of the resulting rounded dielectric edge.

In some cases, a local polishing rate of the dielectric may be affected by dielectric stress near a boundary between the dielectric material and the barrier layer, or a boundary between the dielectric material and the contact pad. As such, spatial variation of the dielectric stress over the hybrid bonding surface may result in a spatially varying polishing rate during a polishing process and therefore excessive rounding of the dielectric edges.

While a level of global (or built-in) stress in the dielectric layer may be controlled by dielectric deposition parameters, the local dielectric stress may be affected by the proximity of dielectric-metal interface near the boundary between the dielectric material and the contact pad. For example, a contact pad that is in a tensile stress may reduce the compressive stress near a dielectric edge that is in contact with the contact pad. At least because polishing rate of the dielectric structure is inversely proportional to the level of compressive stress in the dielectric structure, the dielectric polishing rate near the dielectric edge may be larger than the dielectric polishing rate away from the edge, resulting in a rounded dielectric edge having a large radius of curvature.

In some cases, the formation of rounded dielectric edges having large radius of curvature may be controlled by tailoring the polishing rate of different regions over a hybrid bonding surface (e.g., by adding a layer having lower polishing rate on a region of the hybrid bonding surface). In some such cases, the radius of curvature of rounded dielectric edges may be controlled by controlling dielectric stress and/or dielectric stress variation near a boundary between the dielectric and barrier layer, or near a boundary between the dielectric and the contact pad.

Different stress levels near an edge or surface may lead to different material removal rate from the edge or the surface during a polishing process. Stress variation over a hybrid bonding surface located between two or more contact pads may be affected by the spacing between the contact pads surrounding the bonding surface. In some cases, the stress on a bonding surface may vary from the dielectric edge near a contact pad toward the middle of the binding surface away from the barrier layer. For example, for contact pads having a width of 3 microns, when the spacing between two contact pads is larger than 2 to 3 times the width of the contact pads, the stress in the middle of the boding surface may be substantially equal to the built-in stress in the dielectric layer. In some cases, when the spacing between two contact pads is less than 2 to 3 times the width of each contact pad (e.g., 3 microns), the stress on the dielectric region between the contact pads can be substantially different (less compressive) than the built-in stress in the dielectric layer. In some cases, the change of stress over a bonding surface between two contact pads may increase as the spacing between the contact pads is reduced. In some embodiments, dielectric films are deposited with a built-in compressive stress (e.g., on the order of 100-300 MPa compressive). When the spacing between two contact pads is smaller than 2 times the width of contact pad, the stress in the middle of the bonding surface may be lower (less compressive) than the built-in stress in the dielectric layer. As such in some cases, the dielectric surface between closely spaced contact pads may polish faster and the corresponding dielectric edges may have larger radius of curvature, compared to a dielectric surface between contact pads that are spaced farther from each other.

As described above, the level of stress near a dielectric edge of an opening filled with metal (the contact pad) may be reduced by the tensile stress of the metal. In some cases, the stress level (e.g., compressive stress level) at the edge of a dielectric layer (e.g., an oxide layer) may be lower than intrinsic stress of the dielectric layer, due to a combination of stress reduction during the etching process used to form the opening in which the contact pad is disposed, and the stress state of the conductor material inside the opening (the contact pad). For example, a contact pad may comprise copper (a common metal used to form contact pads) that is in tension as deposited. The tensile stress in copper may reduce the compressive stress in the nearby oxide, even potentially causing the stress state of the oxide to change from compressive to tensile.

Figure 4A:
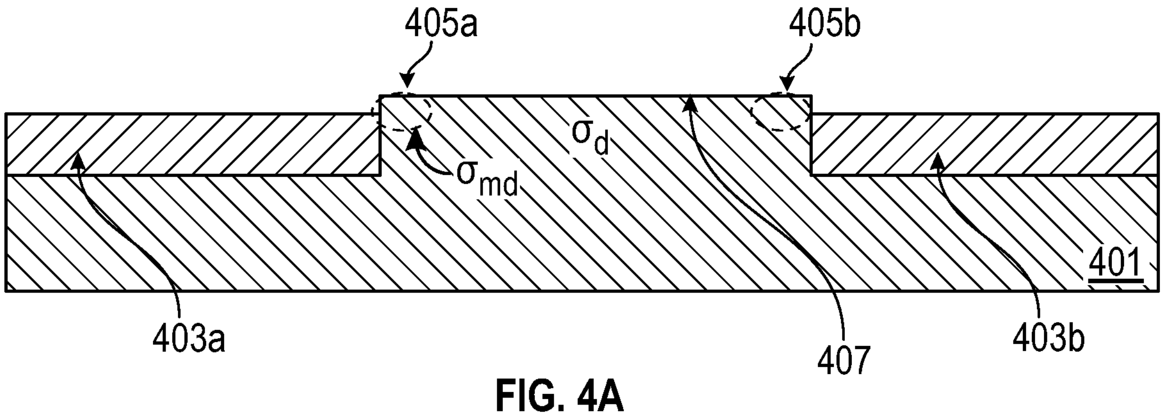
FIGS. 4A and 4B illustrate different distributions of stress density over bonding surfaces of two dielectric layers (or two regions of a dielectric layer). Each bonding surface is bounded by two conductive contact pads, and the spacing between the conductive contact pads of one of the dielectric layers is larger than the spacing between the conductive contact pads of the other dielectric layer.
Figure 4B:
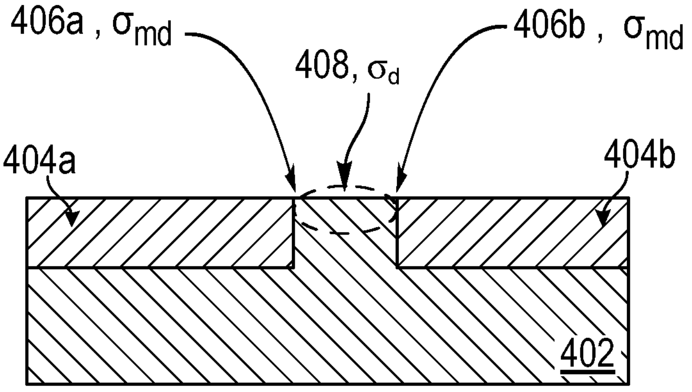

FIGS. 4A and 4B illustrate stress distribution over a portion of the hybrid bonding surfaces of two dielectric layers 401/402 having different metal surface coverages. The dielectric layer 401 has a low metal surface coverage and the dielectric layer 402 has a high metal coverage. In some cases, dielectric layers 401 and 402 may represent two different regions of a single dielectric layer. The dielectric layers 401 has lower metal surface coverage than the dielectric layer 402; as such the two contact pads 404*a*/404*b* of the dielectric layer 402 are closer to each other compared to two pads 403*a*/403*b* of the dielectric layer 401. In some cases, due to large distance between the two metal pads 403*a* and 403*b* the impact of the tensile stress in the metal pads 403*a*/403*b* on the stress level in the middle of the dielectric region 407 between the contact pads 403*a* and 403*b*, can be negligible. For example, with reference to FIG. 4A, while the stress a md near the dielectric edges 405*a*/405*b* may be less compressive, the stress $\sigma_d$ in the middle of the dielectric region 407 may be very close to the intrinsic stress level of the dielectric layer 401 before formation of the contact pads 403*a*/403*b*. In contrast, with reference to FIG. 4B, due to the small distance between the two metal pads 404*a* and 404*b*, the impact of the tensile stress in the metal pads 404*a* and 404*b* on the stress level in the middle of the dielectric region 408 between the contact pads 404*a*/404*b*, can be large. As such, the stress $\sigma_d$ in the middle of the dielectric region 408 of the dielectric layer 402, can be close to the stress $\sigma_{md}$ near the dielectric edges 406*a* and 406*b*.

Figure 4C:
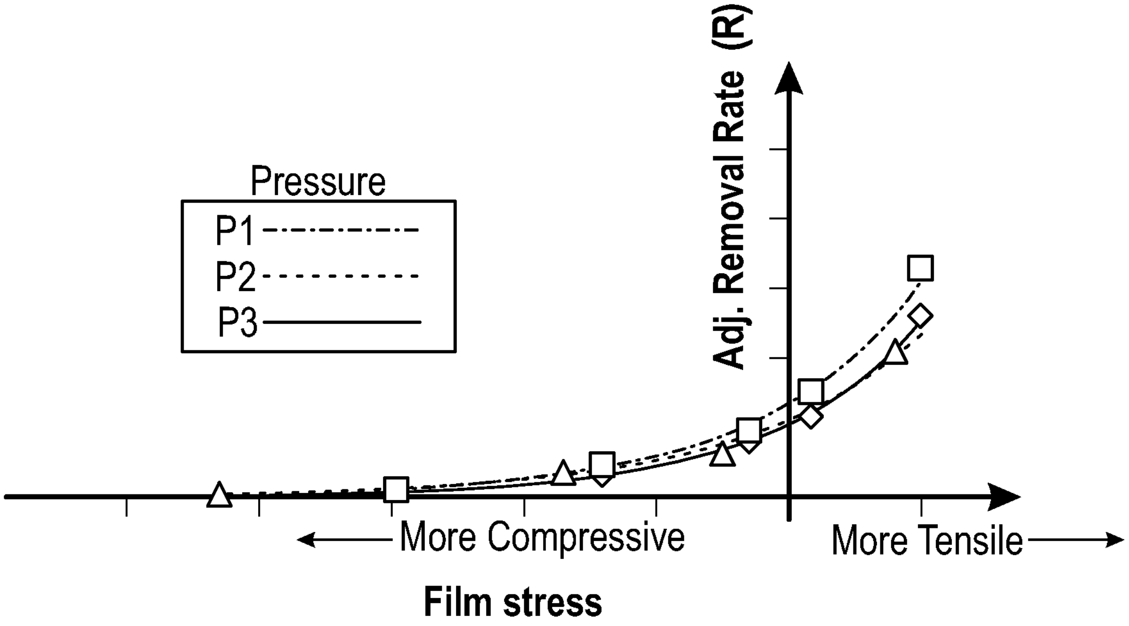
FIG. 4C illustrates dielectric removal rate plotted against dielectric film stress during a polishing process for three different levels of pressure applied on the dielectric film.

FIG. 4C illustrates removal rate (R) of an example dielectric film (silicon dioxide) plotted against dielectric film stress during a CMP polishing process for three different levels of pressure applied on the film. In some cases, the removal rate may increase, when the stress in the film changes from being highly compressive to being tensile. In some cases, the removal rate may increase with the film stress, e.g., when the stress is tensile. With reference to FIGS. 4A and 4B, at least in view of the dependence of removal rate on stress level in a dielectric region (e.g., as indicated in FIG. 4C), the radius of curvature of the dielectric edges 405*a*/405*b* of the dielectric layer 401 may be different from the dielectric edges 406*a*/406*b* of the dielectric layer 402, and the polishing rate of the dielectric edge 406*a* and 406*b* between contact pads 403*a* and 403*b* may have been larger than the etching rate of the dielectric region 407 between contact pads 404*a* and 404*b*. Such a difference in etching rate may result in a height difference between the polished dielectric surfaces between contact pads with different spacing as described below.

As indicated above, stress variation over a bonding surface of a dielectric layer may be associated with a difference between built-in stress in the dielectric layer and residual stress due to proximity of contact pads. The level of built-in stress in a dielectric layer may be correlated with certain material properties of the dielectric layer. In some cases, compressive stress in a dielectric layer may increase with hardness and/or elastic modulus of corresponding dielectric material. In addition to material properties, the deposition method used to dispose the dielectric layer (e.g., on a substrate), and the values of the deposition parameters may affect the compressive in a dielectric layer.

Various embodiments disclosed herein can improve the device yield by reducing the radius of curvature of the rounded dielectric edges over a hybrid bonding surface. Some embodiments disclosed herein may reduce rounding of the dielectric edges by reducing dielectric stress or dielectric stress variation near the dielectric edges.

In some embodiments, the dielectric stress may be controlled by including a polish layer (also referred to as polish stop layer, polish stop, or polish liner) over the dielectric bonding surfaces and/or at the boundary between the dielectric material and the contact pads. In some cases, the removal rate of the polish layer can be smaller than that of the dielectric layer. In some cases, the polish layer may reduce the dielectric removal rate near or at a dielectric edge by reducing the impact of a contact pad in contact with the dielectric on the level and type of stress in the dielectric edge. In some cases, the polish layer may decrease dielectric erosion by reducing the dielectric removal rate in the middle of a dielectric surface between two closely spaced contact pads.

Figure 5A:
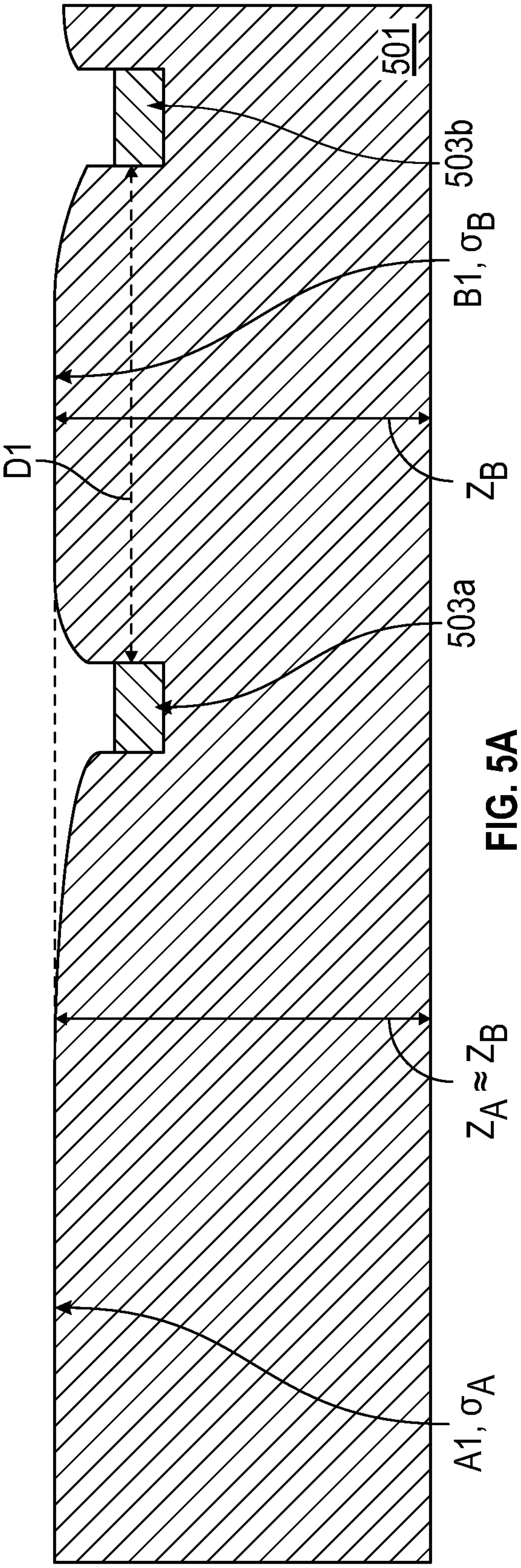
FIG. 5A illustrates the topography of a region of an example polished hybrid bonding surface having low metal surface coverage.

FIG. 5A illustrates the topography of a region of an example polished hybrid bonding surface of a dielectric layer 501, having low metal surface coverage, near two contact pads 503 separated by a distance D1. In some cases, the distance D1 can be larger than the width of the contact pads 503*a*/503*b*. As described above, the stress $\sigma_B$ over the bonding surface B1 between the two contact pads 503*a*/503*b* that are not close to each other may not be affected significantly by the presence of the contact pads 503*a*/503*b*. Thus, the removal rate of the dielectric material from the bonding surface region B1 can be close or substantially equal to the removal rate of the dielectric material from the bonding surface region A1. As a result, once the hybrid bonding surface is polished, a thickness $Z_A$ of the dielectric layer 501 near the bonding surface region A1 can be close or substantially equal to thickness $Z_B$ of the dielectric layer 501 near the bonding surface region B1.

Figure 5B:
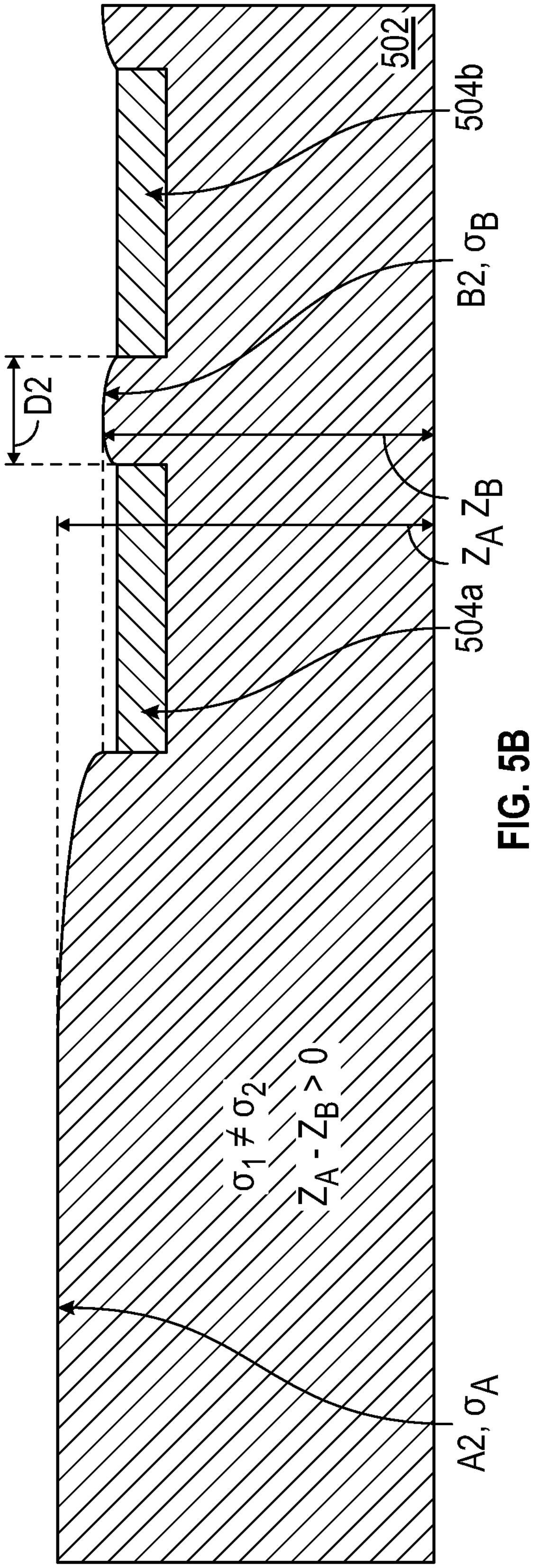
FIG. 5B illustrates the topography of a region of another example polished hybrid bonding surface having high metal surface coverage.

FIG. 5B illustrates the topography of a region of another example polished hybrid bonding surface of a dielectric layer 502, having high metal surface coverage, near two closely spaced contact pads 504*a*/504*b* separated by a distance D2, which is less than the distance D1 of FIG. 5A. In some cases, D2 can be smaller than the 2 to 3 times the widths of the contact pads 504*a*/504*b* embedded in the dielectric layer 502. In some such cases, stress of the copper (e.g., contact pads 504*a*/504*b*) may control the stress at the edges of the dielectric region between the contact pads 504*a*/504*b*.

As described above, the stress $\sigma_B$ over the bonding surface B2 between the two closely spaced contact pads 504*a*/504*b* can be strongly affected by the presence of the contact pads 504. For example, the tensile stress in the contact pads 504*a*/504*b* (e.g., copper contact pads) can make the stress $\sigma_B$ over the bonding surface region B2, less compressive than the stress $\sigma_A$ over a bonding surface region A2 away from the contact pads 504. Thus, the removal rate of the dielectric material from the bonding surface region B2 can be larger than the removal rate of the dielectric material from the bonding surface region A2.

As a result, once the hybrid bonding surface is polished, a thickness $Z_A$ of the dielectric layer 502 near the bonding surface region A2 can be larger than a thickness $Z_B$ of the dielectric layer 502 near the bonding surface region B2. The difference between the thickness of two bonding surfaces of a hybrid bonding surface (e.g., $Z_A$–$Z_B$ in FIG. 5A), may be referred to as erosion. In some cases, dielectric erosion may not allow the bonding surface regions between the closely spaced contact pads of the two dielectric layers to become in contact with each other and form a dielectric bond. As such, dielectric erosion resulted from stress variation over hybrid bonding surface of a dielectric layer, may reduce the strength of the hybrid bond between the dielectric layer and other dielectric layers.

Figure 5C:
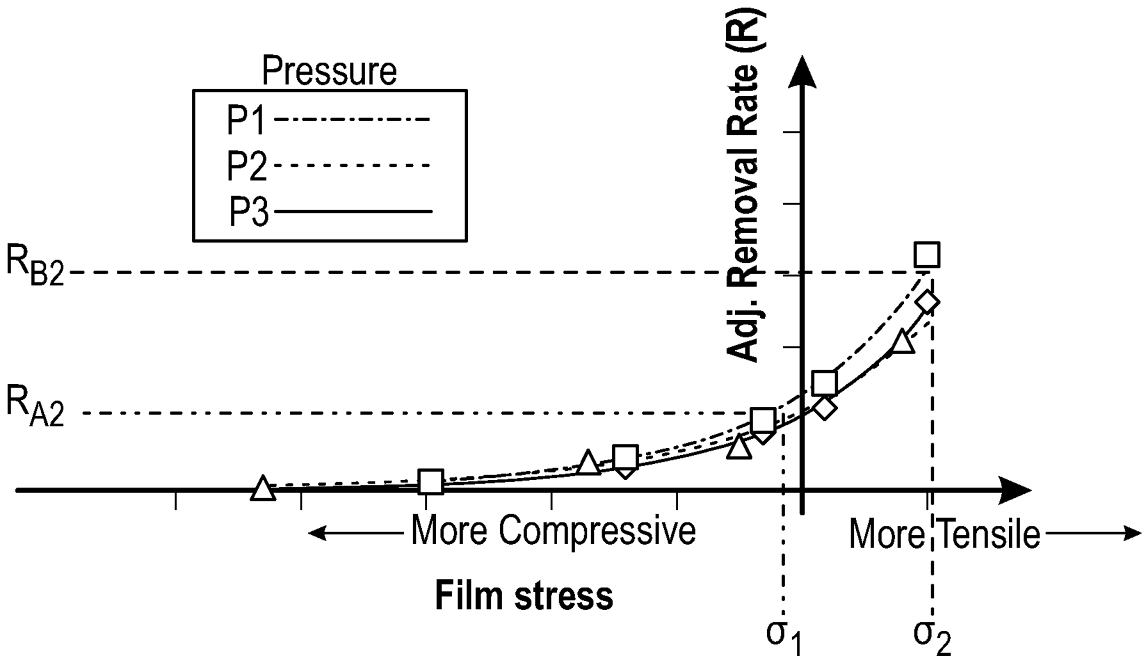
FIG. 5C illustrates the relation between dielectric polishing rate and stress for the bonding surface between the two conductive contact pads ($R_{B2}$) and the bonding surface away from the conductive contact pads ($R_{A2}$), on the dielectric layer shown in FIG. 5B.

In some embodiments, erosion measurement after polishing may be used to detect and quantify the stress variation over a hybrid bonding surface. For example, a measured difference between the dielectric thickness ($Z_A$) near the bonding surface region A2 far from the contact pads 504*a*/504*b*, and the dielectric thickness ($Z_B$) near the bonding surface region B2 between the contact pads 504*a*/504*b* may be used to estimate a difference between the dielectric removal rate near bonding surface region A2 and bonding surface region B2. Subsequently the difference between the dielectric removal rates may be used to estimate stress variation between the bonding surface region A2 and B2. For example, as shown in FIG. 5C, stress $\sigma_1$ over the bonding surface region A2 and stress $\sigma_2$ over bonding surface B2 can be estimated using the plot shown in FIG. 4C and based on estimated dielectric removal rates $R_{A2}$ and $R_{B2}$ near bonding surface regions A2 and B2 respectively.

As described above localized stress and spatial stress variations over a hybrid bonding surface may result in formation of artifacts (rounding, or high spots) and dielectric erosions on the hybrid bonding surface. These artifacts and dielectric erosions formed on the hybrid bonding surface are referred to as stress induced topography. Stress induced topography may be correlated with the relation between polish rate and stress for the dielectric material that is being polished and the special variation of stress over the hybrid bonding layer (e.g., due to presence of contact pads). Thus, in order to reduce stress induced topography, the spatial variation of the stress across the hybrid bonding surface should be low and should be maintained low during the polishing process. Controlling the spatial variation of dielectric stress over a hybrid bonding layer of a dielectric layer is a challenging task due to inherent difference between the type and level of stress in the dielectric layer and in the metals that form the contact pads within the dielectric layer. As such, there is a need for methods that may enable reducing stress induced topography without modifying the material composition and/or the processes used to fabricate a dielectric layer with embedded metallic regions (contact pads). In some implementations, a polish stop dielectric layer (also referred to as a polish stop layer, polish layer, or polish liner) may be disposed on the dielectric layer to protect the corresponding dielectric edges. In some cases, the polish stop layer may comprise a material that has a much lower removal rate during polish layer compared to the dielectric layer In various embodiments, dielectric erosion during the polishing process may be reduced or minimized by adding the polish layer over the dielectric bonding surfaces and/or at the boundary between the field dielectric and the contact pads. In some examples, the polish layer may have a lower polishing rate compared to that of the dielectric layer. In various implementations, a polish layer may comprise diamond-like carbon (DLC), aluminum oxide ($Al_2O_3$), silicon carbonitride (SiCN), silicon carbide (SiC), Silicon Nitride (SiN), various non-conducting oxides, ceramics, glass-ceramics, carbides or nitrides, their various combinations or other materials having polishing rates lower than that of the field dielectric (which may comprise, e.g., silicon oxide). In some embodiments, the hardness of the polish stop layer is larger than the hardness of the dielectric layer on which the polish layer is disposed. During the polishing process, in addition to protecting the dielectric edges, the polishing layer may reduce erosion on a hybrid bonding surfaces, in particular hybrid bonding surfaces comprising closely spaced contact pads. In some cases, the polish layer may reduce the impact of the contact pads on the stress of the field dielectric or dielectric between contact pads, and therefore reduce variation of stress near a dielectric edge of the dielectric layer. As a result, the polish layer may reduce erosion and the radius curvature of the dielectric edge even in the presence of high metal density.

Figure 6:
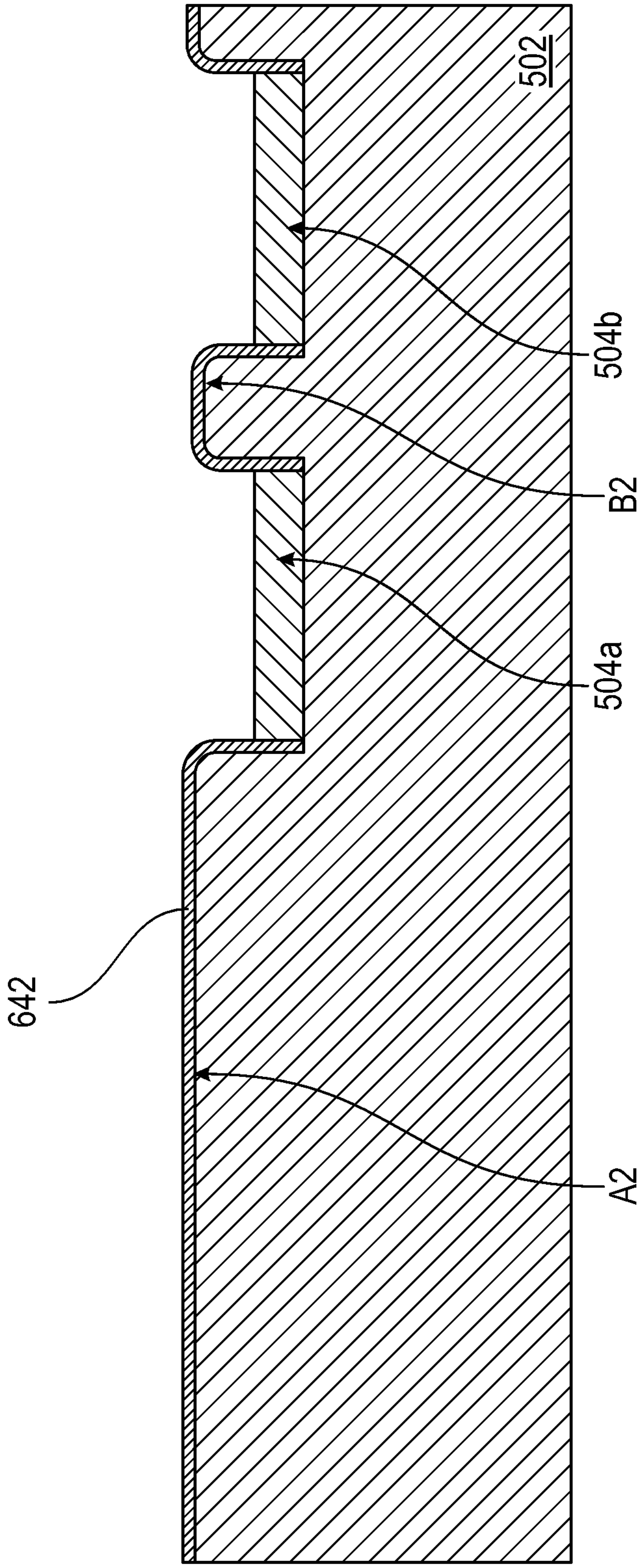
FIG. 6 illustrates topographies of the polished hybrid bonding surface of the dielectric layer shown in FIG. 5B in the presence of a polish layer.

For example, adding a polish layer over the dielectric layer 502 may reduce the erosion ($Z_A$–$Z_B$) of the bonding surface region B2 during the polishing process. FIG. 6 illustrates the topography of a polished hybrid bonding surface of the dielectric layer 502 where a polish layer 642 is disposed on the dielectric bonding surface regions A2 and B2, and the boundary between the dielectric layer and the contact pads 504*a*/504*b*. As shown in FIG. 6, by protecting the dielectric boding surfaces and reducing the impact of the contact pads 504*a*/504*b* on the stress in the field dielectric, the polish layer 642 may simultaneously reduce erosion and the radius of curvature of the dielectric edges over the hybrid bonding surface. In various implementations, the polish layer 642 may comprise an electrically insulating (e.g., a dielectric material) or an electrically conductive material.

FIGS. 7A-7G, FIGS. 8A-8G, and FIGS. 9A-9F illustrate three example fabrication processes for fabricating a dielectric layer (e.g., the dielectric layer of an electronic component) having a polished hybrid bonding surface with at least one conductive contact pad. Advantageously, by adding a polish layer over the dielectric layer, these processes may reduce dielectric erosion and radius of curvature of the dielectric edges formed on the polished hybrid bonding surface. In some examples, one or more dielectric edges between the contact pads and the bonding surface (dielectric bonding surface) may have a radius of curvature less than 20% of a width of the contact pad, less than 10% of the width of the contact pad, or less than 5% of the width of the contact pad after the polishing process, or less than 1% of the width of the contact pad after the polishing process.

The dielectric layer 900 or 1000 may comprise dielectric layers (e.g., the top dielectric layer) of a first element (e.g., a first electronic element) and may be configured to be directly bonded to a dielectric layer of a second element (e.g., a second electronic element), to support formation of one or more interconnects between the two elements. In some cases, an element comprises a substrate and the dielectric layer may be disposed on the substrate. In some examples, the resulting hybrid bonding surface may comprise a polished dielectric bonding surface. In some other examples, the hybrid bonding surface may comprise a polished surface of the polish layer.

Figures 7A, 7B, 7C, 7D, 7E, 7F, 7G:
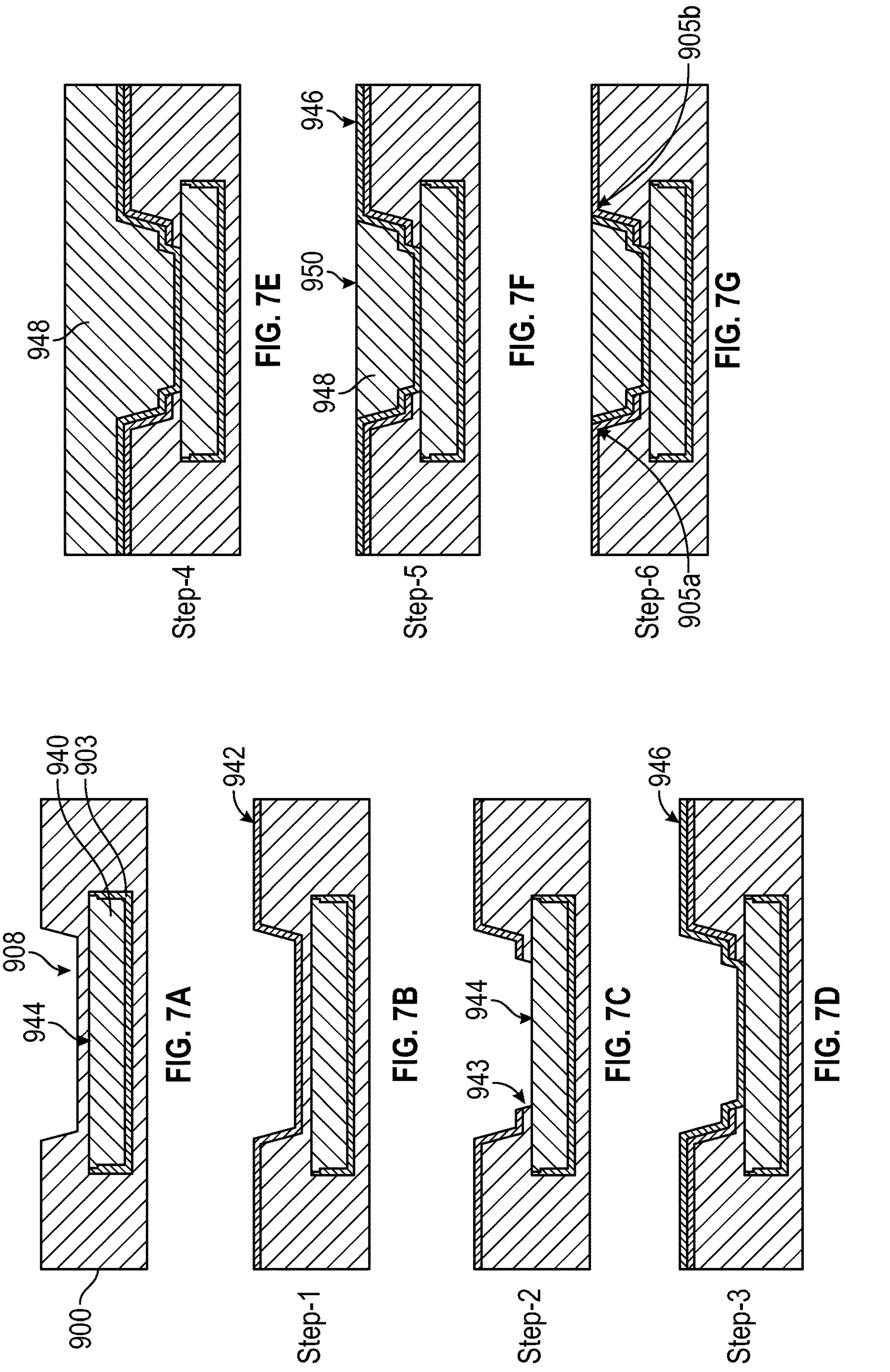
FIGS. 7A-7G illustrate an example process for fabrication of a dielectric layer having a polished hybrid bonding surface with reduced stress induced topography.

FIGS. 7A-7G illustrate a first example fabrication process. As shown in FIG. 7A, the dielectric layer 900 may include a metallization layer (e.g., a redistribution layer or RDL 940) embedded in the dielectric layer 900 and an opening 908 above the RDL 940. The dielectric layer 900 may comprises a dielectric or a semiconductor material. The RDL 940 may comprise an electrically conductive material such as copper, and may electrically connect to circuitry formed in or on the semiconductor element (e.g., in or on a semiconductor device region of the element, not shown). In FIG. 7A, the RDL 940 is embedded within the dielectric layer 900 such that a portion of the dielectric layer 900 is disposed over the RDL 940. It should be appreciated that the dielectric layer 900 may include one or multiple dielectric layers. In some examples, a barrier layer 903 (e.g., a conductive barrier layer) may cover a portion of the RDL 940 surface (e.g., the bottom surface and side surfaces) providing a barrier between the dielectric material and the RDL 940. The opening 908 may be provided on the dielectric layer 900 using an etching process as described with respect to FIG. 1B. In some implementations, a width of the bottom portion of the opening 908 can be smaller than a width of the RDL 940.

The first fabrication process may begin with a first step (step-1) in which a polish layer 942 (also referred to as polish liner or polish stop layer) is disposed or coated on the top surface of the dielectric layer 900. Next, at step-2, a portion of the polish layer 942 and a portion of dielectric material above the top surface 944 of the RDL 940 are removed to expose a portion of the top surface 944 of the RDL 940 (FIG. 7C). For example, a patterned dielectric mask (e.g., a patterned photoresist layer fabricated using lithographic techniques) is provided on the polish layer 942 such that the portion of the polish layer 942 that covers the bottom surface of the opening 908 is exposed, and the exposed portion is etched (e.g., using a wet or dry etching process). As shown in FIG. 7C, after removing a portion of the polish layer 942 and dielectric material above the top surface 944, a sidewall of the resulting opening near and the top surface 944 of the RDL 940, may comprise a stepped portion 943 comprising the polish layer 942 and the dielectric material (or a material from which the dialectic layer 100 is composed).

In some implementations, the etching process may include a first etching process to remove the polish layer 942 and a second etching process to remove the dielectric material. In some cases, first etching process may have a selective chemistry to stop the etching on the dielectric layer and the second etching process may have a selective chemistry to stop the etching on the RDL 940. In some other implementations, short time etching and end point detection may be used to stop each etching process at the interface with the next layer.

At step-3, a barrier layer 946 is conformally or non-conformally disposed on the polish layer 942 and the exposed portion of the top surface 944 of the RDL 940 (FIG. 7D). As shown in FIG. 7D, a portion of barrier layer 946 is in contact with the top surface 944 of the RDL 940, a portion of barrier layer 946 (e.g., near stepped sidewall portion 943) is in contact with dielectric material, and another portion of barrier layer 946 is contact with et polish stop 942. Next, at step-4, a conductive layer 948 is disposed on the barrier layer 946 (FIG. 7E). In some examples, the conductive layer may be formed by electroplating (e.g., in a plating bath containing super-filling additives), or other physical or chemical metal deposition processes. In some cases, the opening 908 may be overfilled with a conductive material to form the conductive layer 948 that covers portions of the barrier layer 946 above the dielectric bonding region. Subsequently, at step-5, the conductive layer 948 may be polished (e.g., using CMP process) to remove a portion of the conductive layer 948 above the dielectric bonding region (field area) and on the barrier layer 946, and provide a smooth surface on the portion of the conductive layer 948 left on the top surface 944 of the RDL 940, forming a conductive contact pad with a polished conductive bonding surface 950 (FIG. 7F). As a result, the sidewalls of conductive contact pad may be in contact with a portion of the barrier layer 946 disposed on the polish stop layer 942. Thus the polish stop layer is disposed between a sidewall of the barrier layer 946 and a sidewall of the dielectric layer 900. In some cases, the CMP may have a selective chemistry to stop the polish on the barrier layer 946. In some examples, the barrier layer 903 (below and around RDL 940) and the barrier layer 946 (disposed on the polish layer 942), may comprise a conductive material such as TaN, TiN, etc. In some examples, the barrier layer 903 and the barrier layer 946, may comprise a metal nitride. In some such examples, a barrier layer 903/946 may comprise a material different from the polish stop layer 942.

In some cases, after polishing (step-5), the polished surface 950 of the conductive layer 948 can be recessed with respect to the surface of the dielectric bonding region and/or the surface of the barrier layer 946.

Finally, at step-6 (FIG. 7G), the barrier layer 946 left above the dielectric bonding region, may be removed (e.g., by etching or another polishing process) to expose the polish layer 942 underneath and provide a smooth surface on the polish layer 942. The etching or the polishing process may have a selective chemistry to stop the polish at the polish stop layer 942. Thus, in the embodiment of FIG. 7G, the polish layer 942 may comprise a portion of the bonding surface that bonds to the other element. In other embodiments, the polish layer 942 can be removed to expose the underlying dielectric layer 900, which may serve as the bonding layer. The presence of the polish layer 942 on the dielectric layer 900 (on the corresponding bonding surface) protects the dielectric edge 905*a* (or corner) and dielectric edge 905*b* between the bonding surface and a sidewall of the opening 908. As a result, the rounding of the dielectric edge 905*a* and 905*b* may be reduced or minimized during the polishing processes between step-4 and step 6. Additionally, the polish layer 942 may reduce erosion of the bonding surface.

Figures 8A, 8B, 8C, 8D, 8E, 8F, 8G:
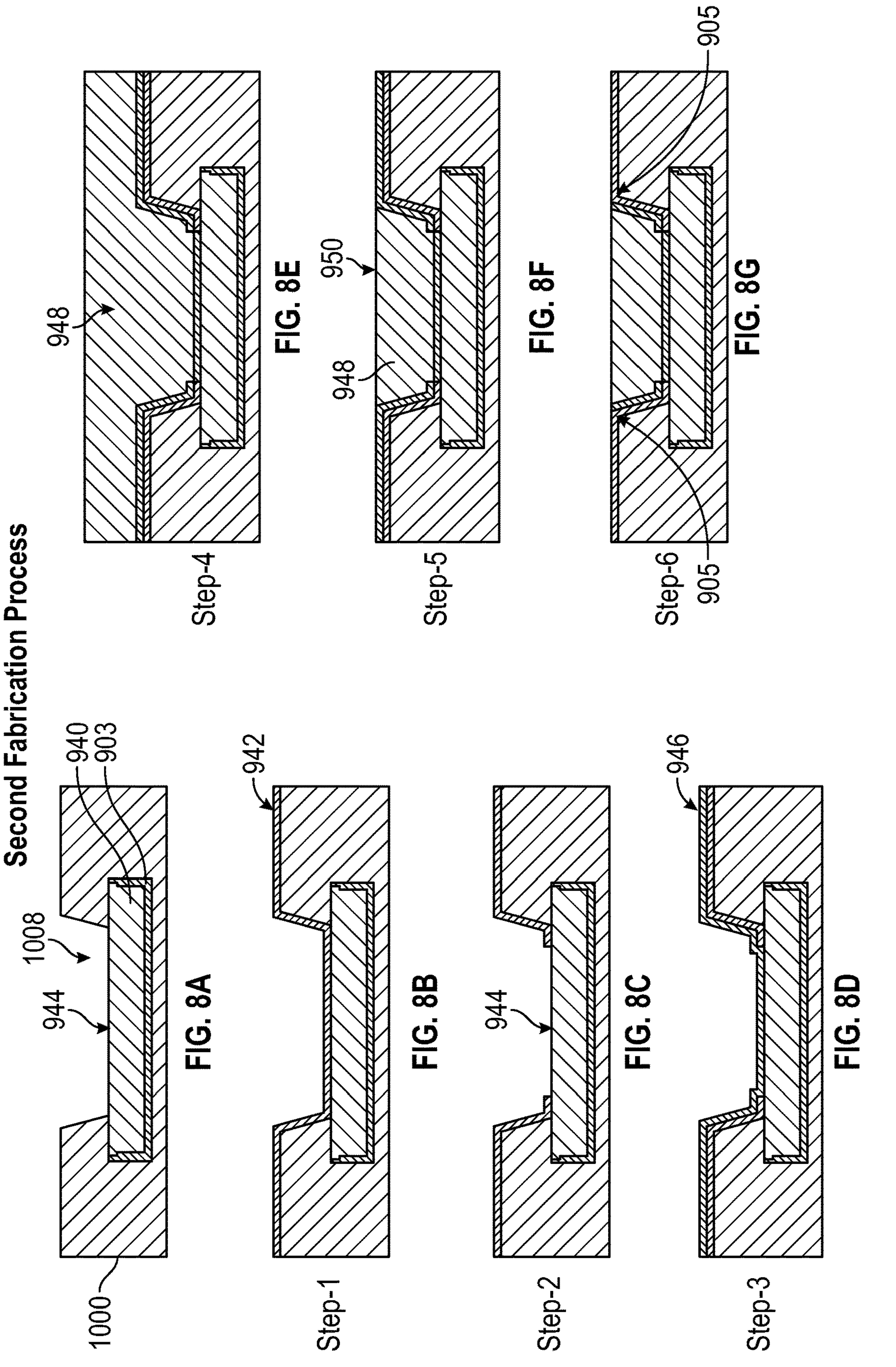
FIGS. 8A-8G illustrate another example process for fabrication of a dielectric layer having a polished hybrid bonding surface with reduced stress induced topography.

FIGS. 8A-8G illustrate a second fabrication process, according to various embodiments. The second fabrication process may comprise one or more features described above with respect to the first fabrication processes. As shown in FIG. 8A, the dielectric layer 1000 may include a redistribution layer (RDL) layer 940 and an opening 1008 above the redistribution layer 940 in which a top surface 944 of the RDL 940 is exposed through the opening 1008. The opening 1008 may be provided on the dielectric layer 1000 using an etching procedure as described with respect to FIG. 1B. In some cases, the opening 1008 may be formed above the RDL 940 using an etching process having a selective etching chemistry to stop etching on the RDL 940 (on the top surface 944 of the RDL 940). In some examples, a barrier layer 903 may cover a portion of the RDL 940 surface (e.g., the bottom surface and side surfaces) providing a barrier between the dielectric material and the RDL 940. The second process may begin by a first step (step-1) in which a polish layer 942 is conformally or non-conformally disposed on the top surface of the dielectric layer 900 and the top surface 944 of the RDL 940 (FIG. 8B). Next, at step-2, a portion of the polish layer 942 disposed on the top surface 944 of the RDL 940 is removed to expose a portion of the top surface 944 of the RDL 940 (FIG. 8C). For example, a patterned dielectric mask is provided on the polish layer 942 such that the portion of the polish layer 942 that covers top surface 944 of the RDL 940 is exposed, and the exposed portion is removed from the top surface 944 using a wet or dry etching process. In some cases, the etching process may have a selective chemistry to stop the etch at the RDL 940. In some cases, after etching, a small portion of the polish stop layer 942 may remain on the top surface 944 of the RDL 940, with an opening formed therethrough to expose at least a portion of the surface 944. Unlike the first process, no dielectric step is formed on the sidewall of the opening at the end of step-2. Step-3 to step-6 of the second fabrication process (FIGS. 8D-8G) may be similar to the step-3 to step-6 of the first fabrication process described above with respect to FIGS. 7D to 7G. However, since no dielectric step is formed on the sidewall of the opening 1008, unlike the structure in FIG. 7D, in FIG. 8D the barrier layer 946 is not in contact with the dielectric material, and a portion of the polish stop layer 942 contacts the RDL layer 940 near the perimeter of the bottom portion of the opening 1008.

In some examples, the polish layer 942 may be bondable to a dielectric layer or polish layer of another element. In such cases, the polished surface of the polish layer 946 (which may be disposed over the dielectric layer 900, 1000) may be treated to activate the surface for direct hybrid bonding. For example, the polished surface of the polish layer 946 may be cleaned and exposed to a plasma and/or etchants to activate the surface. Such surface activation may strengthen direct covalent bonds between the polish layer 946 and another surface (e.g., polished surface of another polish layer or a dielectric bonding surface). In some embodiments, the surface can be terminated with a species (e.g., nitrogen species) after activation or during activation (e.g., during the plasma and/or etch processes).

In some implementations, where the surface of the polish layer 942 is not bondable, the polish layer 942 left on the dielectric bonding region at the end of the first or the second fabrication processes described above (FIG. 7G or 8G) may be removed to expose the dielectric bonding regions on the dielectric layer 900 or 1000. The polish layer 942 may be removed using a polishing or an etching process. In some examples, the polishing or etching process may have a selective chemistry to stop the etching or the polishing at the dielectric layer (e.g., at the dielectric bonding surface). In these implementations, the polished surface of bonding region may be treated to activate the polished bonding surface for direct hybrid bonding. Such surface activation may strengthen direct covalent bonds between dielectric bonding surfaces. For example, the polished bonding surface may be cleaned and exposed to a plasma and/or etchants to activate the surface. In some embodiments, the surface can be terminated with a species (e.g., nitrogen species) after activation or during activation (e.g., during the plasma and/or etch processes).

In some embodiments, deposition of the barrier layer (step-3) may be skipped in the second fabrication process shown in FIGS. 8A-8G. In these embodiments, after step-2 the conductive layer 948 may be directly disposed on the polish layer 942 and on the exposed region of the portion of the top surface 944 of the RDL 940. As such, the conductive layer 948 may directly form an electric contact with the RDL 940. Subsequently, the conductive layer 948 is polished (e.g., using a CMP process) to remove the conductive layer above the dielectric bonding surfaces stopping on the polish stop layer 942. In some cases, a small portion of the polish layer 942 may be removed during the CMP process. In some cases, the resulting planar and smooth surface of the polish layer 942 may be further prepared for bonding to a dielectric bonding surface or a polish layer of another dielectric layer. The preparation process may comprise cleaning and activating the bonding surface of the polish layer 942.

In some embodiments, the polish layer 942 may comprise a conductive material that can form a conductive junction between the RDL 940 and a barrier layer. In some such embodiments, step-2 in the second process (FIG. 8C) may be skipped so that the polish stop layer 942 remains over top surface 944 of the RDL 940. Subsequently, when the barrier layer 946 is disposed at step-3, the portion of the polish layer 942 disposed on the top surface 944, may form a conductive junction between the RDL 940 and the barrier layer 946. In some cases, a conductive polish layer 942 may comprise a thin layer of for example, manganese, conducting metal carbides or borides, or other materials.

Figures 9A, 9B, 9C, 9D, 9E, 9F:
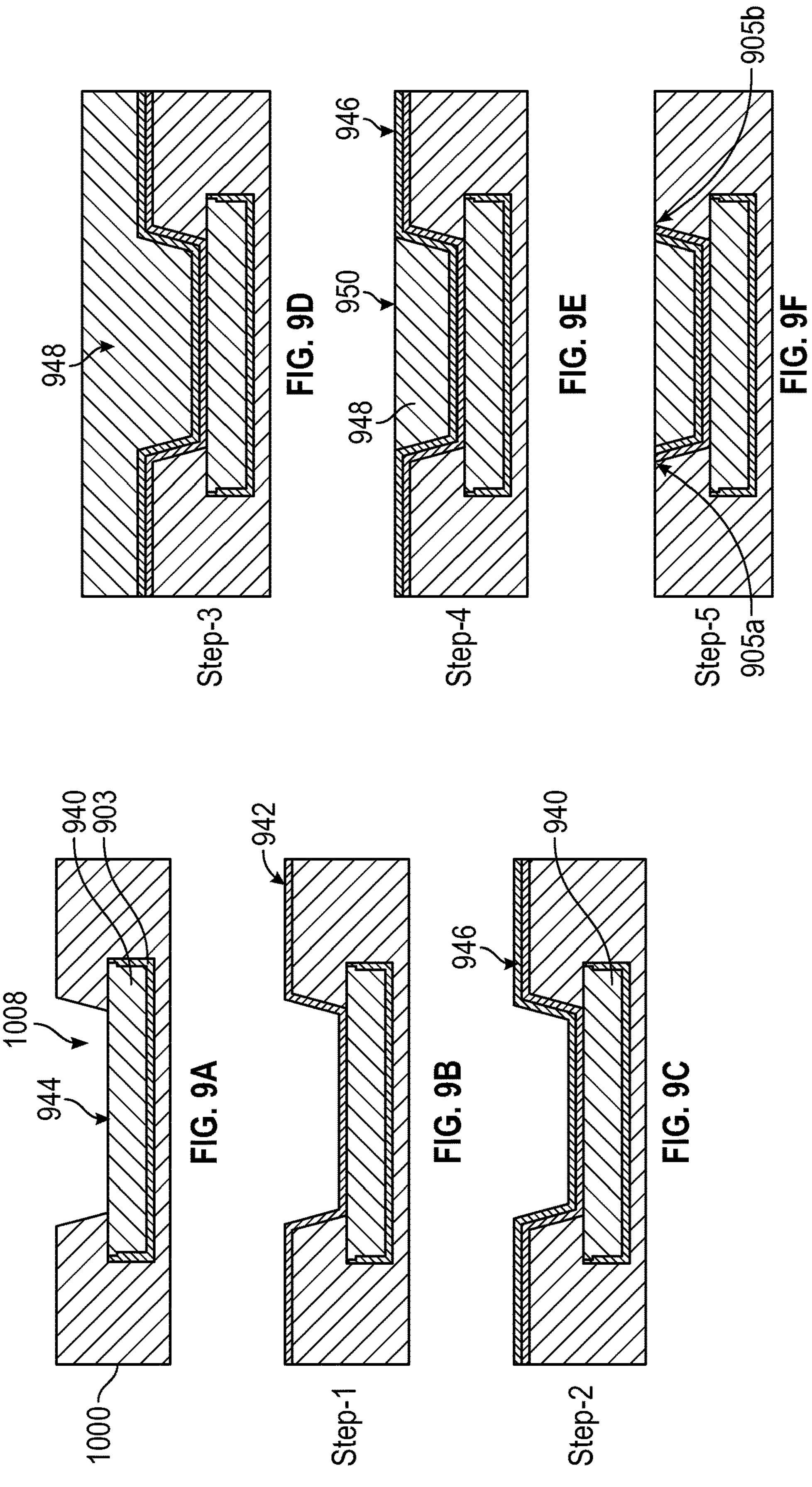
FIGS. 9A-9F illustrate another example process for fabrication of a dielectric layer having a polished hybrid bonding surface with reduced stress induced topography.

FIGS. 9A-9F illustrate the third fabrication process that uses a conductive polish layer to reduce rounding of dielectric edges and erosion. In some examples, the conductive polish layer may comprise manganese, manganese alloys, nickel, or a nickel alloy, or nickel vanadium), The third fabrication process may comprise one or more features described above with respect to the first and second fabrication processes (shown in FIGS. 7A-7G and FIGS. 8A-8G). The structure of the dielectric layer 1000 in FIG. 9A and the first step (FIG. 9B) are similar to those of FIG. 8A and FIG. 8B. At step-2, a barrier layer 946 is disposed on the polish layer 942 (FIG. 9C). Next, at step-3, a conductive layer 948 is disposed on the barrier layer 946 (FIG. 9D). Subsequently, at step-4, the conductive layer 948 may be polished to remove a portion of the conductive layer 948 above the dielectric bonding region and on the barrier layer 946, to provide a smooth surface on the portion of the conductive layer 948 left on the top surface 944 of the RDL 940. As such, the resulting structure (FIG. 9E) has a conductive contact pad with a polished conductive bonding surface 950. Finally, at step-5 (FIG. 9F), the barrier layer 946 and the conductive polish layer 942 above the dielectric bonding region, may be removed to expose the dielectric bonding region and provide a smooth surface on the dielectric bonding region for direct bonding. In embodiments, in which the polish stop is conductive, the polish stop 942 can be removed to prevent shorting other pads. In some cases, step-2 (FIG. 9C) may be skipped in the second process and the conductive layer 948 may be disposed on the polish layer 942 (eliminating the barrier layer 946). In these cases, the conductive polish layer 942, may provide a conductive contact between the RDL 940 and the conductive layer 948.

In some embodiments, the polish stop layer 942 may be continuous on the sidewalls of opening 1008 in the dielectric layer 1000. In other embodiments, the polish stop layer 942 may be discontinuous on the sidewalls of opening 1008 in the dielectric layer 1000. In other embodiments, the polish stop layer 942 may be coated over the bonding surface of dielectric layer 1000 and sidewalls of the opening 1008 but not over the top surface 944 of the RDL 940.

The opening 908 in the dielectric layer 900 (FIG. 7A) and the opening 1008 in the dielectric layer 1000 (FIGS. 8A and 9A) may comprise one or more features described above with respect to the opening 108 in the dielectric layer 100 (FIG. 1B). For example, the bottom surface of the opening 908 (or 1008) can be substantially parallel to the top surface of the dielectric layer 900 (or 1000), and a top width of the opening 908 (or 1008) along a direction parallel to the top surface of the dielectric layer 900 (or 1000) can be more than 20%, or 30% or 50% wider than a bottom width the opening 908 (or 1008) along a direction parallel to top width. In some cases, a sidewall of the opening 908 (or 1008) can be sloped with respect to the top surface of the opening 908 (or 1008). In some examples, the slope of a sidewall of the opening 908 (or 1008) with respect to the bottom surface of the opening the opening 908 (or 1008) can be from 95 to 110, from 110 to 120 degrees, from 120 to 130 degrees, from the 130 to 150 degrees, or any ranges formed by these values, or larger or smaller values. Advantageously, when the sidewalls of the opening 908 (or 1008) are sloped, the rounding of the corresponding dielectric edges (e.g., dielectric edges 905*a* and 905*b*) may be further reduced during the polishing process performed at step-4 (FIGS. 7E/8E) of the first and second fabrication processes, step-3 (FIG. 9D) of the third fabrication process, or any polishing process after these steps (e.g., a polishing process for removing the polish layer 942 from dielectric bonding region at the end of the process).

In some cases, a last polishing process for removing the polish stop layer from dielectric bonding regions, can be a low pressure and slow polishing process. In some cases, the last polishing process for removing the polish stop layer from dielectric bonding regions, further increases a vertical distance between the polished surface 950 of the conductive layer 948 from the surface of the dielectric bonding region.

In some cases, polished surface 950 of the conductive layer 948 may gradually become recessed during the polishing process performed at step-4 (FIGS. 7E and 8E) of the first and second fabrication processes, step-3 (FIG. 9D), or any polishing process after these steps (e.g., a polishing process for removing the polish stop layer from dielectric bonding regions). As a result, after a last polishing step of a process, the polished surface of the conductive layer 948 can be recessed with respect to the surface of the dielectric bonding region, by less than 2 nm, less than 10 nm, or less than 40 nm. In some examples, such recess may provide a gap between two opposite conductive pads of two dielectric layers during direct bonding before the final annealing process that expands the conductive pads and brings them into contact. In some examples, a desired amount of recess (vertical distance between the polished surface 950 of the metal contact and the top surface (biding region) of the corresponding dielectric layer, may depend on a thickness the conductive contact pad formed at the end of the process. A thickness the conductive contact pad can be a vertical distance between bottom surface of the barrier layer 946 (formed at the bottom of the opening 908 or 1008) and the top polished surface 950 of the conductive pad. In some cases, in order to provide the desired recess, after the last step of a process (e.g., processes shown in FIGS. 7, 8 and 9), and additional selective etching step may be performed to further increase the recess.

In any of the processes described above, the presence of the polish layer 942 between the barrier layer and a sidewall of the opening 908 (or 1008), may protect the dielectric edge 905*a* (or corner) and 905*b* between the corresponding bonding surface and the sidewall by slowing down the polishing rate near the dielectric edge a 905*a* and 905*b*.

In some embodiments, the dielectric layers 900 and 1000 in FIGS. 7, 8, and 9, may be dielectric layers of an electronic component. In some such embodiments, the dielectric layer 900 or 1000 may be bonded to two or more other electronic components using the processes described with respect to FIGS. 7, 8, and 9.

In various examples, the thickness of the polish stop layer 942 used in any fabrication processes described above may range between 2 nm to 70 nm. In some cases, the thickness of the polish stop layer 942 can be less than 40 nm.

In various examples, short timed polishing (or short timed etching) and end point detection may be used during a polishing step (or an etching step) to stop the polishing (or etching) process at an interface with the underlying layer having a different composition than the layer that is being polished.

The polish layer 942 may comprise diamond-like carbon (DLC), aluminum oxide ($Al_2O_3$), silicon carbonitride (SiCN), silicon carbide (SiC), or other materials having properties that makes their polishing rate slower than that of the dielectric layer 900 or 1000. In some examples, the polish layer 942 may comprise an insulating material. In some cases, the polish layer 942 may comprise an insulating material having a hardness larger than the hardness of the dielectric layer 900.

In some cases, the conductive barrier may comprise a metal nitride. For example, the conductive barrier may comprise titanium (Ti), titanium nitride (TiN), tantalum (Ta), tantalum nitride (TaN), tantalum oxide (tantalum with a small amount of oxygen content, tungsten (W), tungsten nitride (WN), cobalt-phosphorus alloy (CoP), cobalt-tungsten alloy CoW, Cobalt silicate (CoSi,) Nickel-Vanadium (NiV), and combinations thereof.

In some cases, the polish layer 942 disposed at Step-1 of the first, second, or third processes described above, may have a first thickness along a direction perpendicular to the dielectric bonding surface, and a second thickness along a direction perpendicular to the sidewalls of the opening 908 (or opening 1008). In some such cases, the first and the second thicknesses of the polish layer 942 can be between 5 to 10 nm, 10 to 30 nm, 30 to 50 nm, 500 to 700 nm, or 70 to 110 nm. In some cases, the first and second thicknesses of the polish layer 942 may be less than 2%, 5%, 8%, or 10% of the thickness (t) of the dielectric layer 900 (or dielectric layer 1000). In some implementations, the first and the second thickness can be substantially equal.

In some examples the thickness of the polish layer 942 left on the dielectric bonding region after Step-6 of the first or the second process may be between 1 nm and 50 nm (depending on the initial deposition thickness).

The polish layer and the barrier layer 946 may be disposed using deposition processes including but not limited to, sputtering, Plasma Enhanced Chemical Vapor Deposition (PECVD), sputtering, physical vapor deposition (PVD), atomic layer deposition (ALD) and the like.

In some examples, the smooth surface of the polish layer 942 may be bondable to another smooth surface (e.g., on another polish layer or on a dielectric bonding region). In some implementations, where the surface of the polish layer 942 is not bondable, the polish layer left on the dielectric bonding region after step-6 of the first or the second process, may be removed (e.g., by further polishing or using an etching process), to expose the dielectric bonding regions on the dielectric layer 900 or 1000.

In some implementations, the dielectric edges 905*a* and 905*b* of the resulting structure at the end of the first, second, or third processes (FIG. 7G, FIG. 8G, or FIG. 9F) may comprise a corner of the opening (in which the contact pad is formed), transitioning between the dielectric bonding region (field region) at the upper surface of the dielectric layer 900 or 1000 and the sidewalls of the opening, wherein the corner defines a radius of curvature (ROC) less than 20% of a width of the contact pad, less than 10% of the width of the contact pad, or less than 5% of the width of the contact pad after the polishing process.

In various embodiments, a polished surface of a dielectric bonding surface or a polished surface of a polish layer surface, may have a roughness of less than 10 Å rms, 5 Å rms, 3 Å rms, or 2 Å rms.

Terminology

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An electronic component for bonding to a first electronic component, comprising:
- an upper dielectric layer having an opening therein;
- a conductive barrier layer lining at least sidewalls of the opening;
- a polish stop layer underlying the conductive barrier layer at least between the conductive barrier layer and the upper dielectric layer at the sidewalls;
- a conductive filler within the opening over the conductive barrier layer; and
- a lower conductive feature below the opening,
- wherein an upper surface of the electronic component is planarized and treated for direct hybrid bonding
- wherein a hardness of the polish stop layer is higher than a hardness of the upper dielectric layer.

2. The electronic component of claim 1, wherein the polish stop layer comprises a material selected from the group consisting of diamond-like carbon, aluminum oxide, silicon carbonitride, silicon carbide and combinations thereof.

3. The electronic component of claim 1, wherein the upper surface comprises an upper portion of the polish stop layer over the upper dielectric layer, wherein the upper surface is activated and terminated with a species to strengthen direct covalent bonds with another electronic component.

4. The electronic component of claim 1, wherein the opening has a corner transitioning between a field region at the upper surface and the sidewalls, wherein the corner defines a radius of curvature of less than 100 times a thickness of the barrier layer.

5. The electronic component of claim 1, wherein a bottom of the opening comprises a lower conductive element and the polish stop layer is coated on a top surface of the lower conductive element.

6. The electronic component of claim 5, wherein the polish stop layer comprises a conductive material.

7. The electronic component of claim 1, wherein the electronic component is directly bonded to a second electronic component.

8. The electronic component of claim 1, wherein angles between the sidewalls of the opening and the upper surface are larger than 100 degrees.

9. A bonded structure comprising:
- a first element comprising a first nonconductive field region, the first nonconductive field region comprising:
  - a first opening;
  - a first conductive contact pad disposed in the first opening;
  - a first polish stop layer lining at least sidewalls of the first opening; and
  - a first conductive barrier layer disposed at least between the first conductive contact pad and a portion of the first polish stop layer coated on the sidewalls of the first opening; and
- a second element directly bonded to the first element without an adhesive by way of a hybrid bond, wherein a hardness of the polish stop layer is higher than a hardness of an underlying dielectric layer of the first nonconductive field region.

10. The bonded structure of claim 9, wherein the second element comprises a second nonconductive field region, the second nonconductive field region comprising:

a second opening, a second conductive contact pad disposed in the second opening, a second polish stop layer lining at least sidewalls of the second opening, and a second conductive barrier layer disposed at least between the second conductive contact pad and a portion of the second polish stop layer coated on the sidewalls of the second opening.

11. The bonded structure of claim 9, wherein the hybrid bond comprises a bond formed between a bonding surface of the first nonconductive field region and a bonding surface of the second nonconductive field region.

12. The bonded structure of claim 9, wherein:

the first polish stop layer further covers a bonding surface of the first nonconductive field region and the sidewalls of the first opening, and the second polish stop layer further covers a bonding surface of the second nonconductive field region and the sidewalls of the second opening.

13. The bonded structure of claim 12, wherein the hybrid bond comprises a bond formed between a portion of the first polish stop layer coated on the bonding surface of the first nonconductive field region and a portion of the second polish stop layer coated on the bonding surface of the second nonconductive field region.

14. The bonded structure of claim 10, wherein the hybrid bond further comprises a first bond formed between the first conductive contact pad and the second conductive contact pad.

15. The bonded structure of claim 10, wherein a portion of the first conductive barrier layer is in electrical contact with a first redistribution layer below the first conductive contact pad and a portion of the second conductive barrier layer is in electrical contact with a second redistribution layer below second conductive contact pad.

16. The bonded structure of claim 15, wherein a portion of the first polish stop layer is in contact with the first redistribution layer and a portion of the second polish stop layer is in contact with the second redistribution layer.

17. The bonded structure of claim 16, wherein the first polish stop layer is a conductive material.

18. The bonded structure of claim 10, wherein:

the first opening has a corner transitioning between a bonding surface of the first nonconductive field region and the sidewalls of the first opening, the second opening has a corner transitioning between a bonding surface of the second nonconductive field region and the sidewalls of the second opening, wherein each corner defines a radius of curvature of less than 10% of a width of the first and the second conductive contact pads.

19. A directly bonded element comprising:

an opening in a dielectric layer over a substrate of the element;

a polish stop layer on a field area of the dielectric layer and sidewalls of the opening;

a planar conductive material disposed over the polish stop layer in the opening in the dielectric layer; and a direct bond interface comprising two directly bonded conductive surfaces and a surface of the polish stop layer, wherein a hardness of the polish stop layer is higher than a hardness of the dielectric layer beneath.

20. The directly bonded element of claim 19, further comprising a barrier layer disposed between the polish stop layer and the planar conductive material.

* * * * *